(12) United States Patent
Tanabe

(10) Patent No.: US 7,408,962 B2
(45) Date of Patent: Aug. 5, 2008

(54) DEMULTIPLEXER APPARATUS AND COMMUNICATION APPARATUS USING THE SAME

(75) Inventor: Akira Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 1121 days.

(21) Appl. No.: 10/380,249

(22) PCT Filed: Sep. 14, 2001

(86) PCT No.: PCT/JP01/08018

§ 371 (c)(1),
(2), (4) Date: Mar. 13, 2003

(87) PCT Pub. No.: WO02/23737

PCT Pub. Date: Mar. 21, 2002

(65) Prior Publication Data

US 2003/0174737 A1 Sep. 18, 2003

(30) Foreign Application Priority Data

Sep. 14, 2000 (JP) ............................. 2000-280681

(51) Int. Cl.
*H04J 3/04* (2006.01)
(52) U.S. Cl. ...................................... 370/535; 370/536
(58) Field of Classification Search .................. None
See application file for complete search history.

(56) References Cited

U.S. PATENT DOCUMENTS

| 5,119,402 | A | * | 6/1992 | Ginzburg et al. ............ 375/288 |
|---|---|---|---|---|
| 5,248,971 | A | | 9/1993 | Mandl |
| 5,526,361 | A | * | 6/1996 | Hedberg ..................... 370/518 |
| 5,596,609 | A | | 1/1997 | Genrich et al. |
| 5,612,695 | A | * | 3/1997 | Ueda .......................... 341/101 |

FOREIGN PATENT DOCUMENTS

| EP | 1 005 201 A2 | 5/2000 |
|---|---|---|
| GB | 1 223 154 A | 2/1971 |
| JP | 59-215118 | 12/1984 |
| JP | 62-272626 | 11/1987 |
| JP | 08-223229 | 8/1996 |
| JP | 2000-165246 | 6/2000 |

OTHER PUBLICATIONS

European Search Report dated May 3, 2004.
Japanese Office Action dated Oct. 26, 2004, with partial English translation.

* cited by examiner

*Primary Examiner*—Edan Orgad
*Assistant Examiner*—Jung Park
(74) *Attorney, Agent, or Firm*—McGinn IP Law Group, PLLC

(57) ABSTRACT

A demultiplexer apparatus has a plurality of integrating circuits which operate in parallel. The plurality of integrating circuits receive in parallel an input time-series binary data. One of the plurality of integrating circuits in a current stage converts the input binary data into multi-value data in the current stage, and generates recovery data in the current stage based on the multi-value data and recovery data from one of the plurality of integrating circuits in a stage immediately or more previous to the current stage integrating circuit. The plurality of integrating circuits output the generated recovery data as parallel data to the input binary data. In this way, the demultiplexer apparatus which can read the input binary data with a frequency component exceeding a maximum operation frequency is provided.

24 Claims, 22 Drawing Sheets

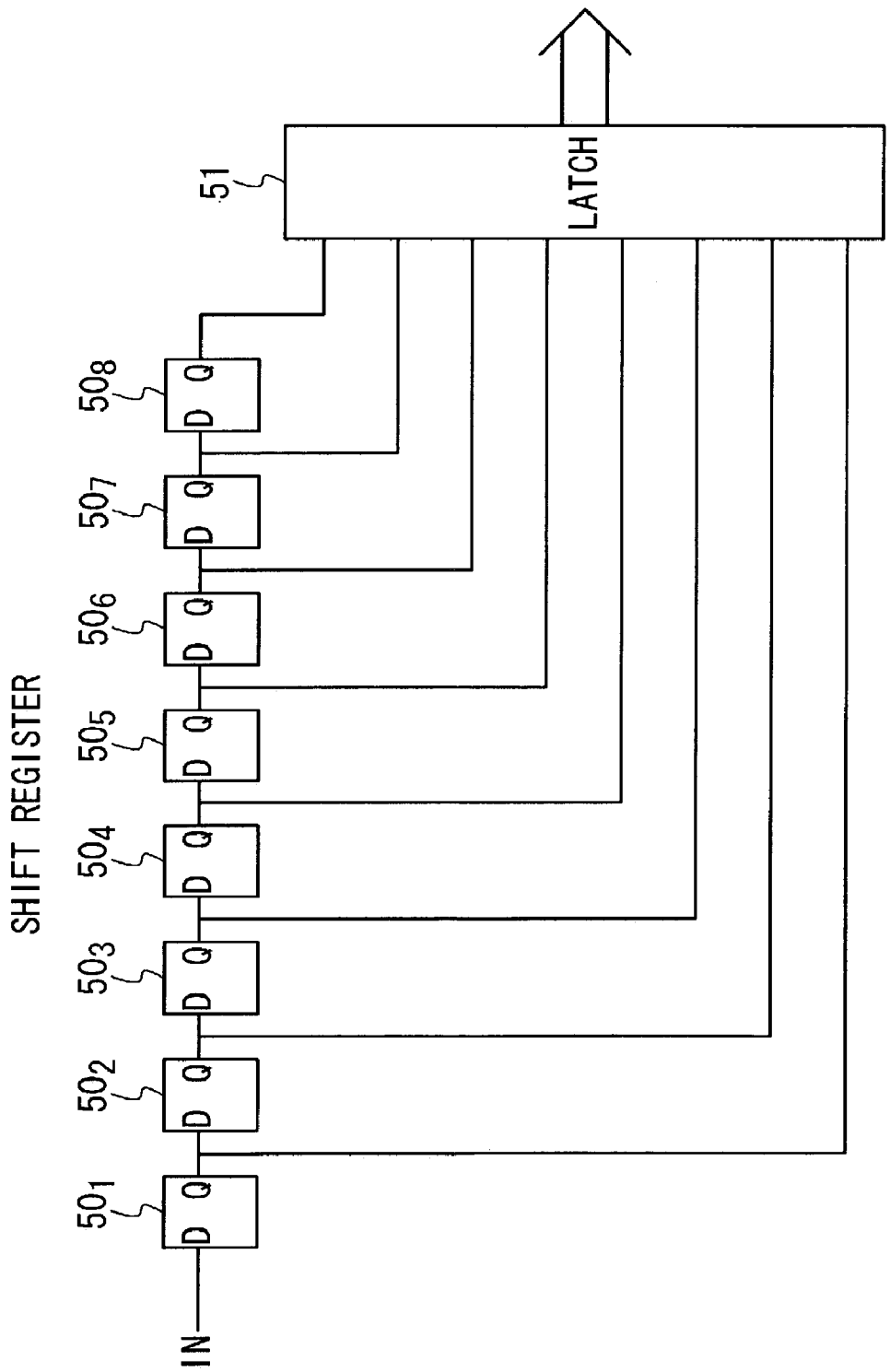

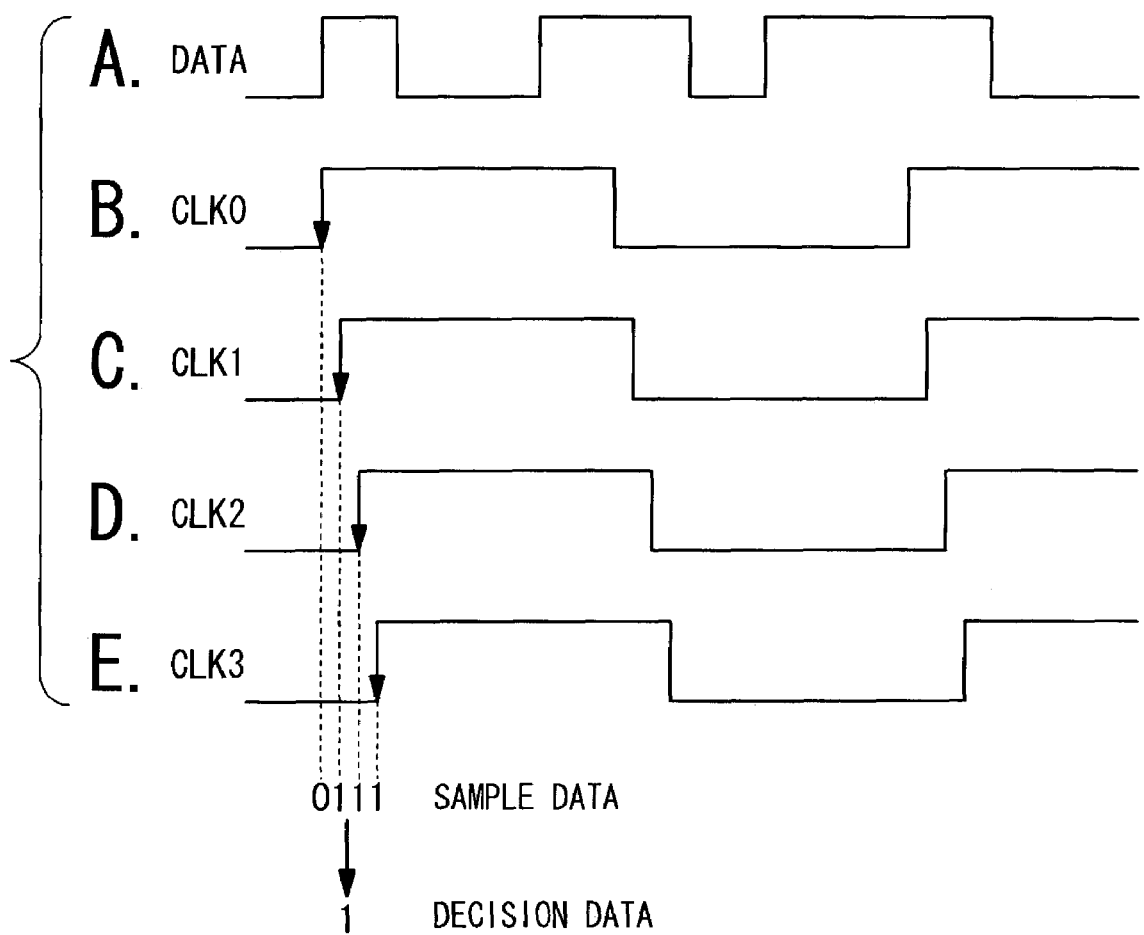

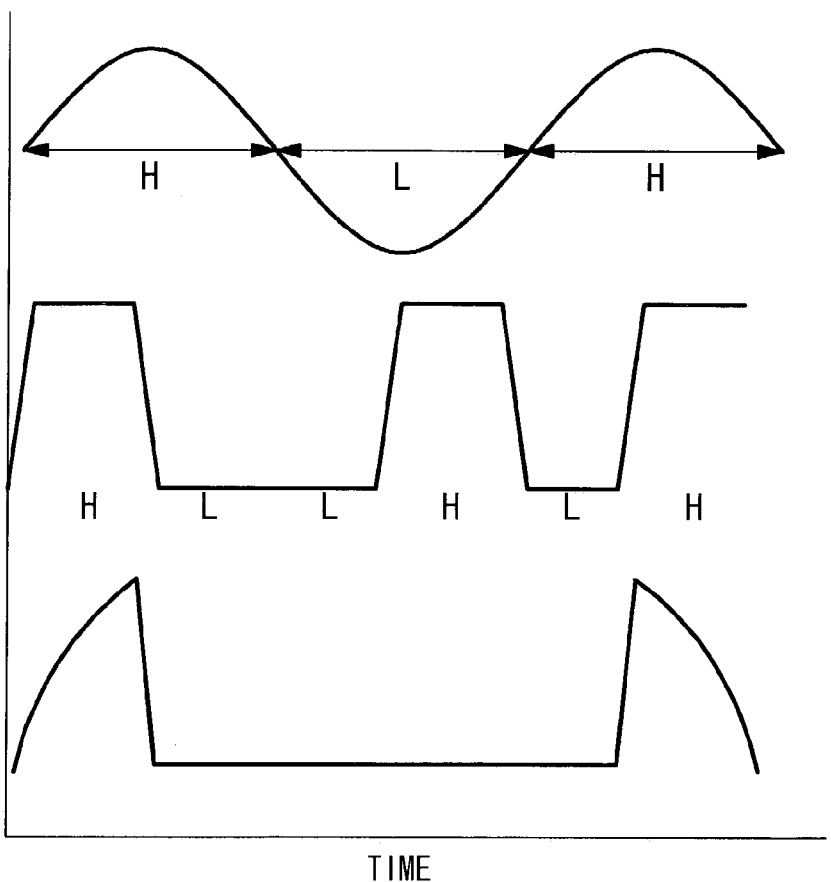

FOR REFERENCE
VOLTAGE H

FOR REFERENCE
VOLTAGE L

FOR EVEN BIT

FOR ODD BIT

US 7,408,962 B2

DEMULTIPLEXER APPARATUS AND COMMUNICATION APPARATUS USING THE SAME

TECHNICAL FIELD

The present invention relates to a demultiplexer apparatus and a communication apparatus using the same.

BACKGROUND ART

In a conventional communication apparatus, a receiver uses a demultiplexer apparatus, and the demultiplexer apparatus uses a demultiplexer circuit DEMUX. FIG. 1 shows the circuit structure example of a conventional demultiplexer apparatus of a shift register type. Referring to FIG. 1, the conventional demultiplexer apparatus of the shift register type has D-type flip-flops $50_1$ to $50_8$ connected as a cascade of a plurality of stages (8 stages in the example shown in FIG. 1). A latching circuit 51 receives in parallel the outputs of the D-type flip-flops $50_1$ to $50_8$. Data is shifted for each clock through the D-type flip-flops. Thus, the number of process bits per clock is one. Such a technique is disclosed in, for example, IEICE Trans. Electron, (Vol. E78-C, No.12, 1995, p.1746): conventional reference 1).

FIGS. 2A and 2B show the circuit structure example of a conventional demultiplexer apparatus of a tree type. Referring to FIG. 2A, in the conventional demultiplexer apparatus of the tree type, 1:2 demultiplexers DEMUX 60 ($60_1$ to $60_7$) are hierarchically arranged. As shown in FIG. 2B, the 1:2 demultiplexer DEMUX $60_1$ at a first stage defines an operational rate and alternately reads the data for the flip-flops in two systems. Thus, it can process the data of two bits for each clock. Such a technique is disclosed in, for example, IEICE Trans. Electron, (Vol. E78-C, No.12, 1995, p1746: conventional reference 2).

Also, an over-sampling method is proposed in which one data is read a plurality of times. Such a technique is disclosed in, for example, Symp. On VLSI Circuits Digest of Technical papers (1997, p.71: conventional reference 3).

In a method of using binary logic flip-flops in an input unit, in any case of the logics, the input section is operated as schematically shown in FIGS. 3A and 3B. In FIG. 3A, a switch SW1 is closed (turned on) in a former part of a one-clock period, and a switch SW2 is opened (turned off). An input data is sampled by a capacitor C. As shown in FIG. 3B, the switch SW1 is opened (turned off) in a latter part of the one-clock period, and the switch SW2 is closed (turned on). The data held by the capacitor C is sent to a flip-flop at a next stage (not shown).

If the frequency of the clock used for the sampling is the maximum operational frequency of a transistor to be used, in order to carry out the accurate sampling, one sampling requires at least a sampling time equal to half the clock period. In short, the data rate that can be attained by this method is (the maximum operational frequency×2).

In the over-sampling method, as shown in FIGS. 4A to 4E, the data (DATA) is sampled the plurality of times at timings slightly different from each other. That is, multi-phase clocks CLK0 to CLK3 are used to carry out the sampling. The data is recovered from the plurality of sample data by using a weighting function. In the example shown in FIGS. 4A to 4E, the data is sampled at edges of a 4-phase clock, and 1 is recovered as a recovery data (Decision Data) from 0111. Consequently, in this case, the possible data rate is greater than (the maximum operational frequency×2).

By the way, in FIGS. 4A to 4E, the waveform of the clocks CLK0 to CLK3 is illustrated as a rectangular wave. However, if a transistor is used such that the frequency of the clock is close to its maximum operational frequency, the waveform of the clock becomes a sine wave. For this reason, the sample data contains an error because of the influence of the data before and after the data of a target to be read. This results in a problem that it is difficult to reduce an error rate.

In conjunction with the above-mentioned description, a sign converting circuit is disclosed in Japanese Laid Open Patent Application (JP-A P2000-165246). In the sign converting circuit for optical dual binary transmission in this reference, a bit distributor receives a high speed input signal and distributes this signal into low speed signals into N (N is an integer of 2 or more) systems. N sign converters are provided for the distributed low signals of the N systems, and each perform the sign conversion on the low speed signals, respectively. A bit synthesizer receives the low speed signals after the conversions of the N signs respectively outputted from the N sign converters, and logically operates and synthesizes those respective low speed signals, and then generates a high speed output signals after the sign conversions. Each of the sign converting circuits includes an EXOR circuit for generating an EXOR output of the corresponding low speed signal and a delayed feedback signal one bit before.

DISCLOSURE OF INVENTION

Therefore, an object of the present invention is to provide a demultiplexer apparatus that can accurately read a serial data having a frequency exceeding a maximum operational frequency of a transistor to be used and output a parallel data, and a communication apparatus using the same.

In an aspect of the present invention, the demultiplexer apparatus includes a plurality of integrating circuits that are operated in parallel. The plurality of integrating circuits receive input time-series binary data commonly. Each of a current stage of the plurality of integrating circuits converts the input binary data into multi-value data, and generates recovery data in the current stage in accordance with the multi-value data and recovery data at a previous stage integrating circuit to the current stage integrating circuit. The plurality of integrating circuits output the generated recovery data as parallel data to the input binary data.

Here, each of the plurality of integrating circuits generates the recovery data in the current stage in accordance with the converted multi-value data and the recovery data from the previous stage integrating circuit, and outputs the generated recovery data to one of the plurality of integrating circuits in a next stage.

It is preferable that each of the plurality of integrating circuits is operated at a timing shifted for one bit of the input binary data from the previous stage integrating circuit.

Also, each of the plurality of integrating circuits has a converting unit for converting the input binary data into the multi-value data for every predetermined bit quantity.

Also, the converting unit adds the input binary data n data by n bits (n is an integer of 1 or more) and generates the multi-value data.

Also, the converting unit has an adder, and the adder has a capacitor and a switch. The switch operates in response to a clock signal to carry out the addition such that a charge is stored in the capacitor and then the stored charge is discharged from the capacitor based on the input binary data, or such that the charge is discharged and then the capacitor is charged based on the input binary data. At this time, the adder may have a transfer gate connected to the capacitor and an output capacitor connected through the transfer gate to the capacitor. It is preferable that the capacitance of the output capacitor is smaller than that of the capacitor. Also, it is preferable that the capacitance of the capacitor is variable based on a period per each data quantity of the input binary data.

Also, when a plurality of MOSFETs are provided to connect their gate electrodes in parallel, the capacitance of the capacitor may be adjusted by forming or extinguishing a gate channel of each of the plurality of MOSFETs based on a period per data in the input binary data.

Preferably, the waveform of the clock signal is determined such that current values with regard to the capacitor in first and final portions in the addition are smaller than a current value during a period between the first and final portions in the addition.

Also, preferably, each of the plurality of integrating circuits further has a plurality of comparing circuits for converting the multi-value data into a set of binary data, and different thresholds are allocated to the plurality of comparing circuits.

Each of the plurality of integrating circuits may further have a recovering unit for generating the recovery data in the current stage in accordance with the set of the binary data and the recovery data from a previous stage integrating circuit.

Also, each of the plurality of integrating circuits may include a plurality of recovering circuits provided for recovery data estimations from the integrating circuit in the previous stage, and a selecting circuit for selecting and outputting one of the recovery data estimation from the plurality of recovery data, on the basis of the recovery data at the previous stage, as the recovery data at the current stage. Here, each of the plurality of recovering circuits generates the recovery data estimation on the basis of the set of binary data and a corresponding one of the recovery data estimations.

Also, each of the plurality of integrating circuits may include a plurality of recovering circuits, a first switch for sequentially selecting one of the plurality of recovering circuits and sending the set of binary data to the selected recovering circuit, and a second switch for selecting one of the plurality of recovering circuits and outputting the recovery data in the current stage from the selected recovering circuit. Each of the plurality of recovering circuits generates the recovery data in the current stage on the basis of the set of the binary data and the recovery data of the integrating circuit at a previous stage.

Preferably, each of the plurality of integrating circuits has a latching circuit for adjusting timings such that the generated recovery data are simultaneously outputted as the parallel data to the input binary data.

Also, the demultiplexer apparatus may have a plurality of integrating circuits, and each of the plurality of integrating circuits may have the plurality of integrating circuits.

Also, the demultiplexer apparatus may include a plurality of integrating units and a selector for selecting one of the plurality of integrating units and outputting an output data from the selected integrating circuit as the parallel data. Here, each of the plurality of integrating units has the above plurality of integrating circuits. At this time, each of the plurality of integrating circuits may have a latching circuit for adjusting timings such that the generated recovery data are simultaneously outputted as the parallel data to the input binary data.

Also, each of the plurality of integrating circuits may have a first converting unit for generating a first multi-value data from the input binary data for each data of a predetermined number and a second converting unit for generating a second multi-value data from the input binary data for each data of the predetermined quantity. The multi-value data contains the first multi-value data and the second multi-value data, and the second multi-value data contains data of a polarity opposite to that of the first multi-value data. At this time, each of the first and second converting units adds the input binary data by n data (n is an integer of 1 or more) and generates the multi-value data.

Also, each of the first and second converting units may have an adder, and the adding circuit may have a capacitor and a switch. The switch operates in response to a clock signal to carry out the addition such a charge is stored in the capacitor and then the stored charge is discharged from the capacitor based on the input binary data, or such that the stored charge is discharged, and then the capacitor is charged based on the input binary data. At this time, the adding circuit may have a transfer gate connected to the capacitor and an output capacitor connected through the transfer gate to the capacitor. Preferably, a capacitance of the output capacitor is smaller than that of the capacitor.

Also, it is preferable that the capacitance of the capacitor is variable based on a period per data of the input binary data. At this time, the capacitance of the capacitor may be adjusted, when a plurality of MOSFETs are provided to connect their gate electrodes in parallel, a channel of each of the plurality of MOSFETs is formed or extinguished on the basis of the period per data in the input binary data.

Also, preferably, the waveform of the clock signal is determined such that current values through the stored charge at the first and final portions in the addition are smaller than that in a period between the first and final portions in the addition.

Also, preferably, each of the plurality of integrating circuits may be provided for the fist and second converting units and further have a plurality of comparing circuits for converting the multi-value data into sets of binary data. In this case, preferably, the same thresholds are allocated to the plurality of comparing circuits. Each of the plurality of integrating circuits may further have a recovering unit for generating a recovery data in the current stage in accordance with the set of the binary data and the recovery data from a previous stage integrating circuit.

Also, each of the plurality of integrating circuits may have a latching circuit for adjusting the timings such that the generated recovery data are simultaneously outputted as the parallel data to the input binary data.

Preferably, a communication apparatus includes any of the above-mentioned demultiplexer apparatuses.

In another aspect of the present invention, the demultiplexer apparatus includes first to N-th integrating circuits (N is an integer of two or more) operating in parallel, which commonly receive a serial binary data. The first to N-th integrating circuits are operated in response to first to N-th clock signals whose phases are different from one another. Each of the integrating circuits refers to an output of the integrating circuit at a previous stage, and the integrating circuit at the first stage refers to an output of the N-th integrating circuit. Each of the integrating circuits includes an adding circuit for adding the serial binary data for a plurality of bits, a comparing circuit for comparing a multi-value data obtained by the addition through the adding circuit with a reference voltage and then generating a plurality of binary data, and a recovering unit for recovering a parallel binary data from the plurality of binary data outputted from the comparing circuits and the output result of the integrating circuit at the previous stage, and outputs at least a part of the recovered parallel binary data to the integrating circuit at a next stage.

Also, the adding circuit has a first conductive type of a first MOS transistor, a second conductive type of a second MOS transistor and the second conductive type of a third MOS transistor which are connected in series between a high potential side power supply and a low potential side power supply. A clock signal to be sent to the integrating circuit is supplied to gates of the first MOS transistor and the third MOS transistor, and the serial binary data is inputted to a gate of the second MOS transistor. The adding circuit is further composed of a first capacitor, in which one end is connected to a connection point between drains of the first MOS transistor and the second MOS transistor, the other end is connected to the low or high potential side power supply, and a capacitance is variable, a transfer switch, which is connected between the one end of the first capacitor and the output end of the adding circuit and controlled so as to be turned on and off by the clock signal, and a second capacitor in which one end is connected to a connection point between the transfer switch and the output end, and the other end is connected to the low or high potential side power supply. A capacitance of the second capacitor is smaller than a capacitance of the first capacitor. At this time, when the third MOS transistor whose gate receives the clock signal is in an on state, the transfer switch is in the on state. When the third MOS transistor is at an off state, the transfer switch is at the off state.

Also, when the adding operation using the first capacity is ended, the transfer switch is turned off, and the second capacity is separated from the first capacity. After that, the first capacity is discharged or charged, and then returned to the state before the adding operation. At a start of a next adding operation, the transfer switch is turned on, and the second capacity and the first capacity are set at the same voltage.

Also, the integrating circuit may further include a latching circuit for receiving the output from the recovering unit, adjusting the timing and outputting as the output data.

Preferably, the clock signal sent to the integrating circuit has its phase which is delayed for one bit, as compared with the clock signal sent to the integrating circuit at the previous stage.

Also, preferably, the recovering unit has a circuit for recovering even-numbered bits and a circuit for recovering odd-numbered bits.

Moreover, preferably, the communication apparatus includes any of the above-mentioned demultiplexer apparatuses.

BRIEF DESCRIPTION OF DRAWINGS

FIG. 1 is a diagram showing the circuit structure of a conventional demultiplexer apparatus of a shift register type;

FIGS. 4A to 4E are diagrams showing an operational principle of a conventional demultiplexer apparatus of an oversample method;

FIGS. 12A to 12C are timing charts showing an operation of the adding circuit in the integrating circuit of the demultiplexer apparatus in the first embodiment;

BEST MODE FOR CARRYING OUT THE INVENTION

Hereinafter, a demultiplexer apparatus of the present invention and a communication apparatus using the same will be described in detail with reference to the attached drawings.

Figure 24:
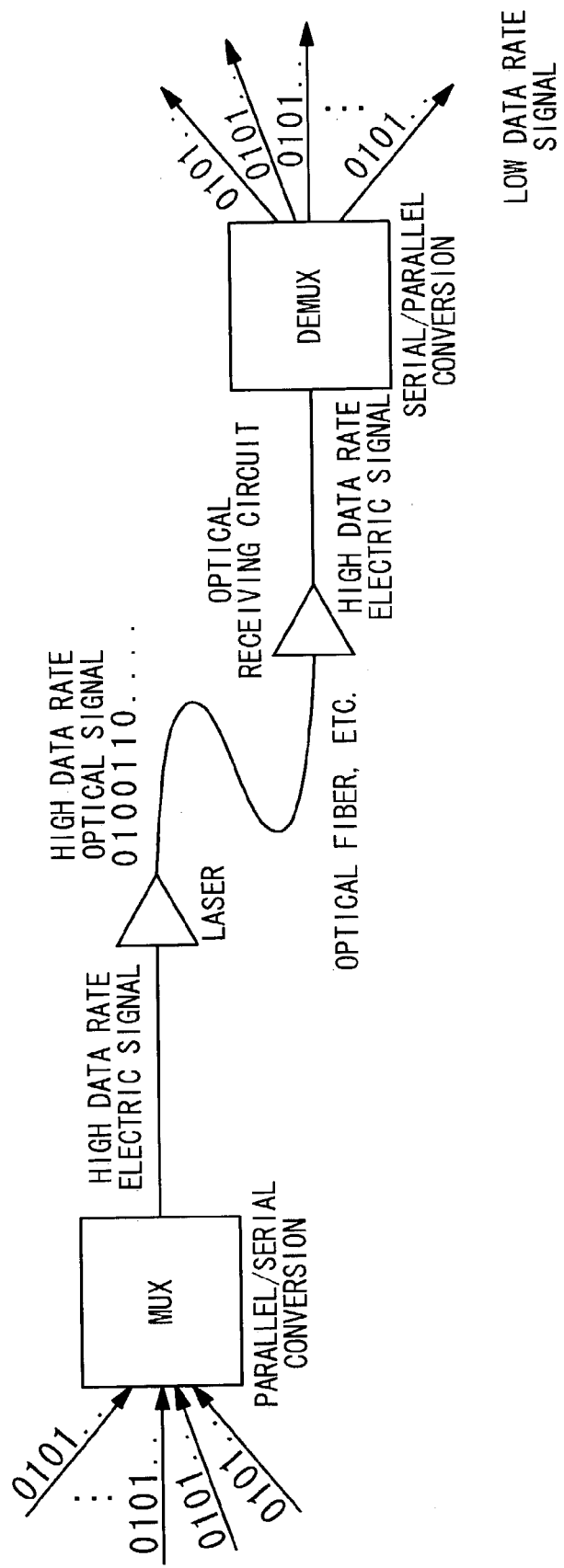
FIG. 24 is a block diagram showing the circuit structure of a communication apparatus to which the demultiplexer apparatus of the present invention is applied.

In the communication apparatus using the demultiplexer apparatus of the present invention, as shown in FIG. 24, a low data rate parallel data is converted into a high data rate serial data by a multiplexer apparatus (MUX). The converted serial data as an electric signal is transmitted to a remote portion, as they are. Or, as shown in FIG. 24, the electric signal is converted into an optical signal by a laser and then transmitted. In a receiving circuit, the optical signal is converted into an electric signal by an optical receiving circuit and returned to the low data rate parallel data by a demultiplexer apparatus (DEMUX). In such a communication apparatus, a receiving section uses the demultiplexer apparatus (DEMUX) of the present invention.

Figure 2A:
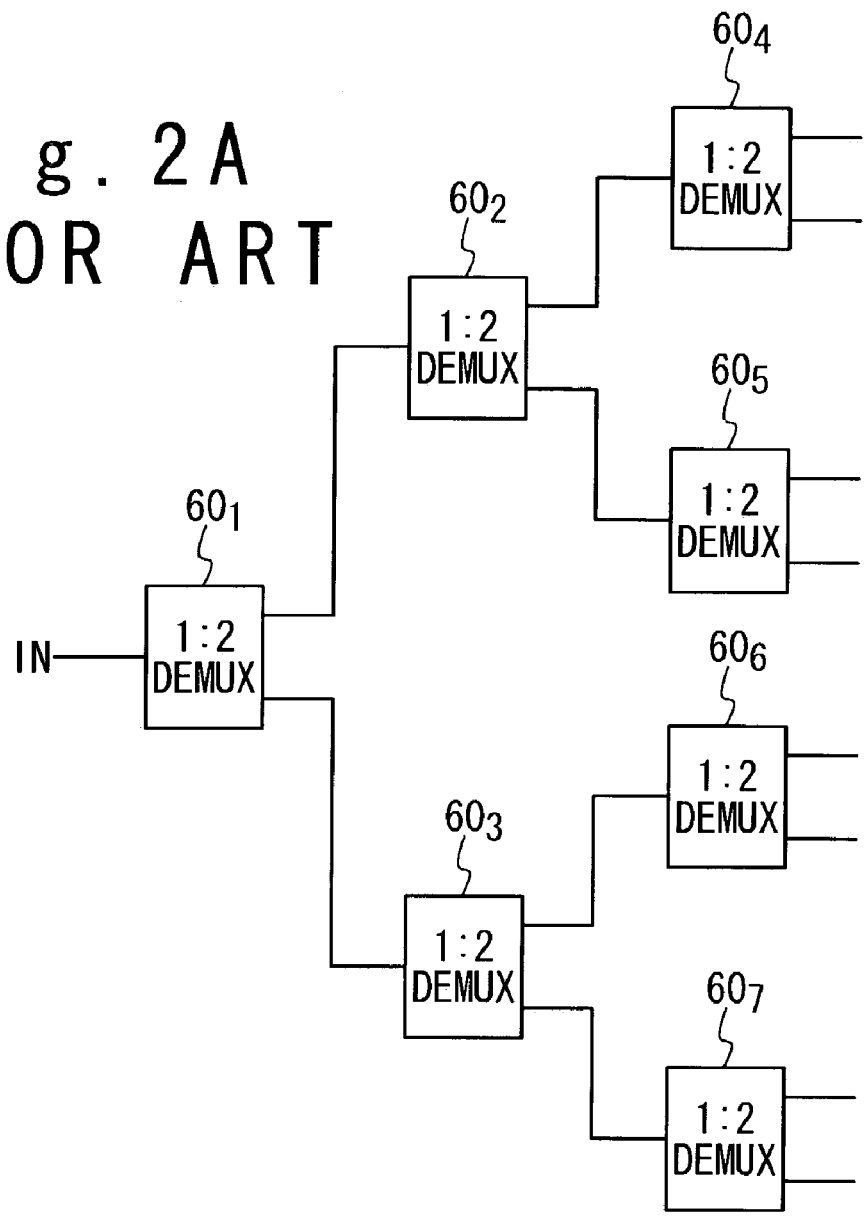
FIGS. 2A and 2B are diagrams showing the circuit structure of a conventional demultiplexer apparatus of a tree type.
Figure 2B:
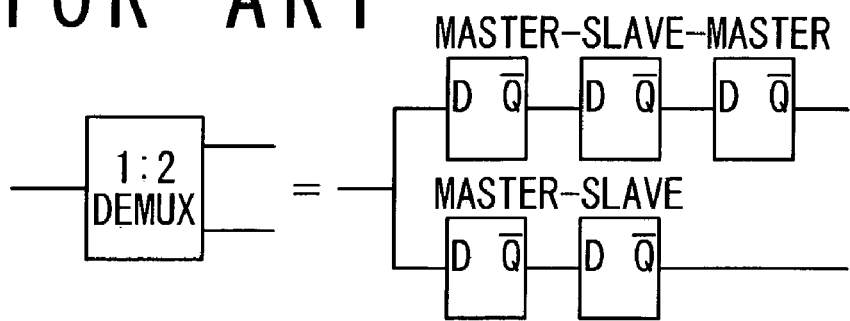
Figure 3A:
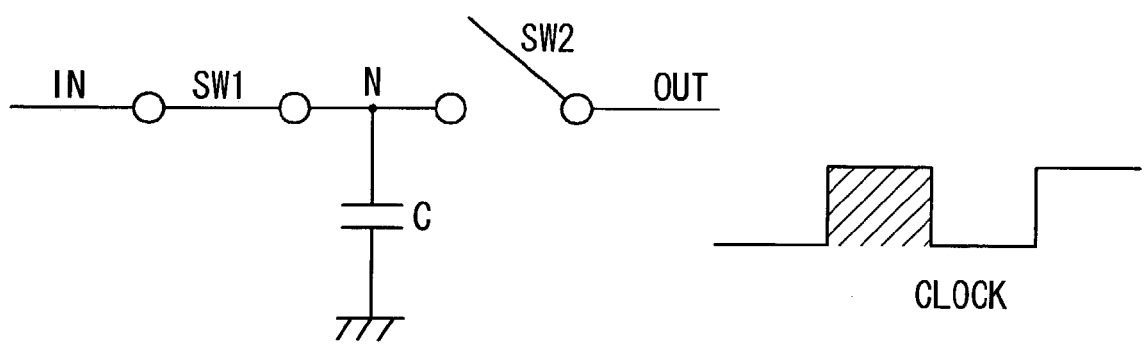
FIGS. 3A and 3B are diagrams showing an operation of a conventional demultiplexer apparatus.
Figure 3B:
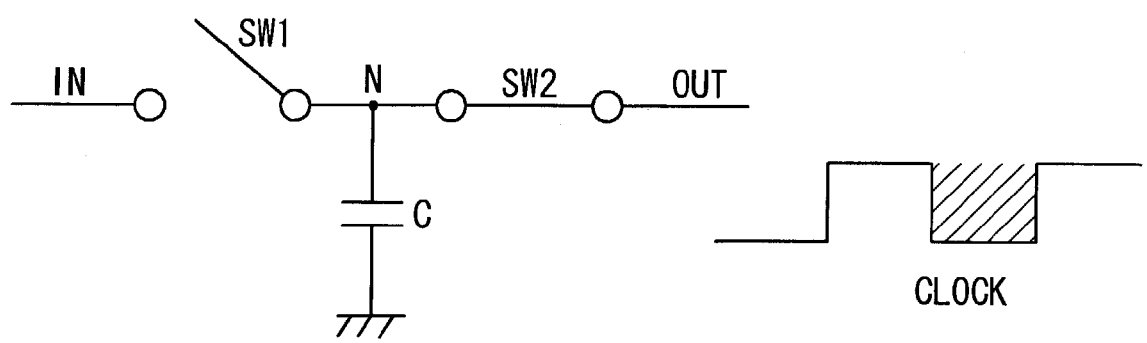
Figure 5:
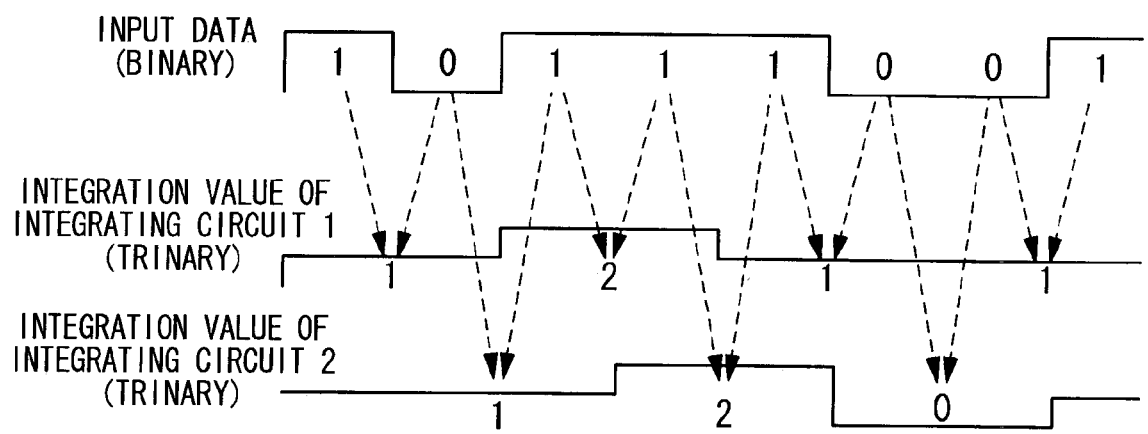
FIG. 5 is a diagram showing an operational principle of a demultiplexer apparatus of the present invention.

FIG. 5 is a diagram showing the principle of the demultiplexer apparatus of the present invention. With reference to FIG. 5, the demultiplexer apparatus includes integrating circuits 1 and 2 of two systems. Each of the integrating circuits adds two-bit data at the timings shifted for one bit. Consequently, a trinary data, which is any of 0, 1 and 2, is obtained from each of the integrating circuits 1 and 2, on the basis of an input data. Each of the integrating circuits recovers an original binary data from this multi-value data.

Figure 25:
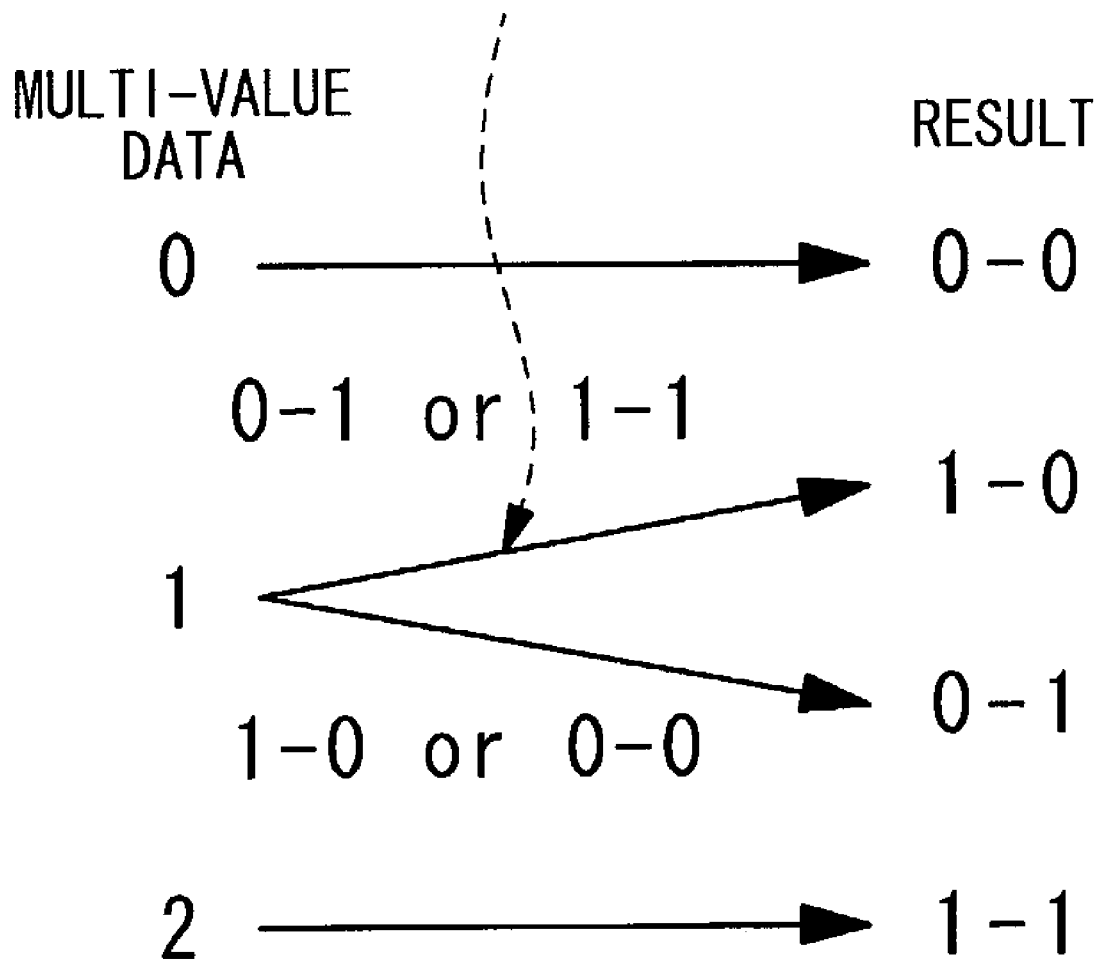
FIG. 25 is a diagram showing an operational principle of the demultiplexer apparatus of the present invention.

This recovering algorism will be described. If the trinary data is 0 or 2, the original binary data can be instantly determined to be 0-0 or 1-1. However, if the trinary data is 1, whether the original binary data is 0-1 or 1-0 cannot be determined from only the trinary data. In the present invention, the determination is carried out by referring to an output data of a different integrating circuit at this time. In short, if the integration result of the integrating circuit itself is 1 and an output of another integrating circuit operated earlier for one bit of an input data is 0-1 or 1-1, the data read by the integrating circuit itself can be determined to be 1-0. If the output of the other integrating circuit is 1-0 or 0-0, the data read by the integrating circuit itself is 0-1. In short, an algorism shown in FIG. 25 is achieved.

From the above viewpoint, in the present invention, the integrating circuits 1 and 2 of the two systems add the two-bit data that are shifted for the one bit between them, and one of the integrating circuits 1 and 2 refers to the addition result of the other. Thus, the determination of the data is carried out. In short, if the integration result or addition result of the integrating circuit 2 is 1 and the output of the integrating circuit 1 is 0-0 or 1-0, the output of the integrating circuit 2 becomes 0-1. If the output of the integrating circuit 1 is 0-1 or 1-1, the output of the integrating circuit 2 becomes 1-0.

Consequently, a determination table shown in a table 1 can be prepared as follows.

TABLE 1

| output of integrating circuit 1 | x | 0-0 | 0-1 | 1-0 | 1-1 | x |
|---|---|---|---|---|---|---|
| integration value of integrating circuit 2 | 0 | 1 | 1 | 1 | 1 | 2 |
| output of integrating circuit 2 | 0-0 | 0-1 | 1-0 | 0-1 | 1-0 | 1-1 |

In this way, it could be understood that correct data can be recovered with reference to the opposing data. However, if 1 and 0 are alternately inputted such as 10101010..., this method cannot know the first bit of "1" in the input data string. Thus, this method cannot determine all of the data after that. Actually, if the data is always 10101010..., information can not be transmitted. Therefore, a pattern of 00 or 11 appears necessarily. In short, on and after that pattern, the data can be normally determined.

In this example, the clock signal used for the integrating circuit is ¼ of the data rate. Thus, the input data can be processed at the data rate of four times of the maximum operation frequency of the transistor to be used.

FIG. 5 exemplifies the configuration when the data of the two bits is read at a time. However, in accordance with the principle similar to the above-mentioned case, the integrating circuits of the n systems (n is an integer of 2 or more) are provided to carry out the integration of the input data n bits by n bits at the timings shifted for one bit. In this case, each of the integrating circuits can carry out the process at the data rate of 2n times of the maximum operational frequency. In this way, in the present invention, since the plurality of data are read in the one input data reading operation, and the original data can be recovered at the operational frequency lower than the frequency component of the input data.

Figure 6:
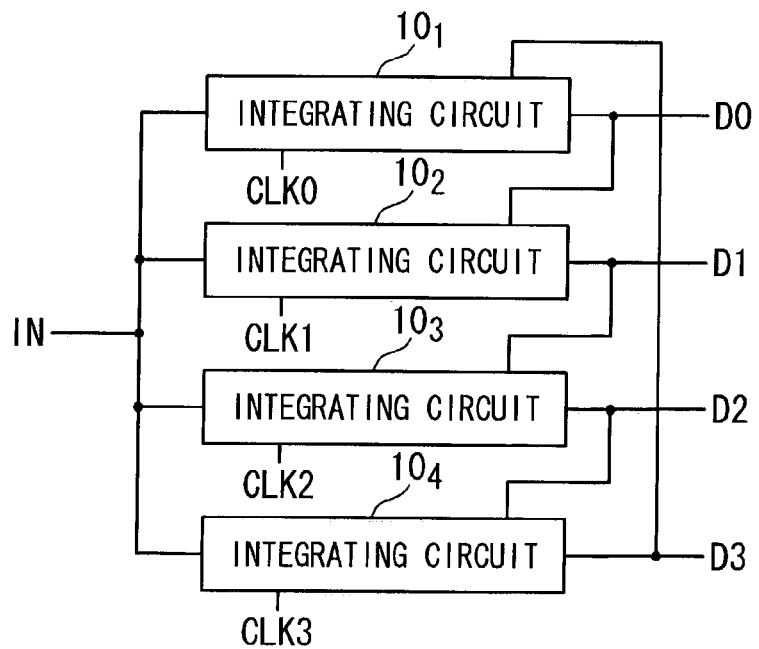
FIG. 6 is a block diagram showing the circuit structure of a demultiplexer apparatus according to a first embodiment of the present invention.
Figure 7:
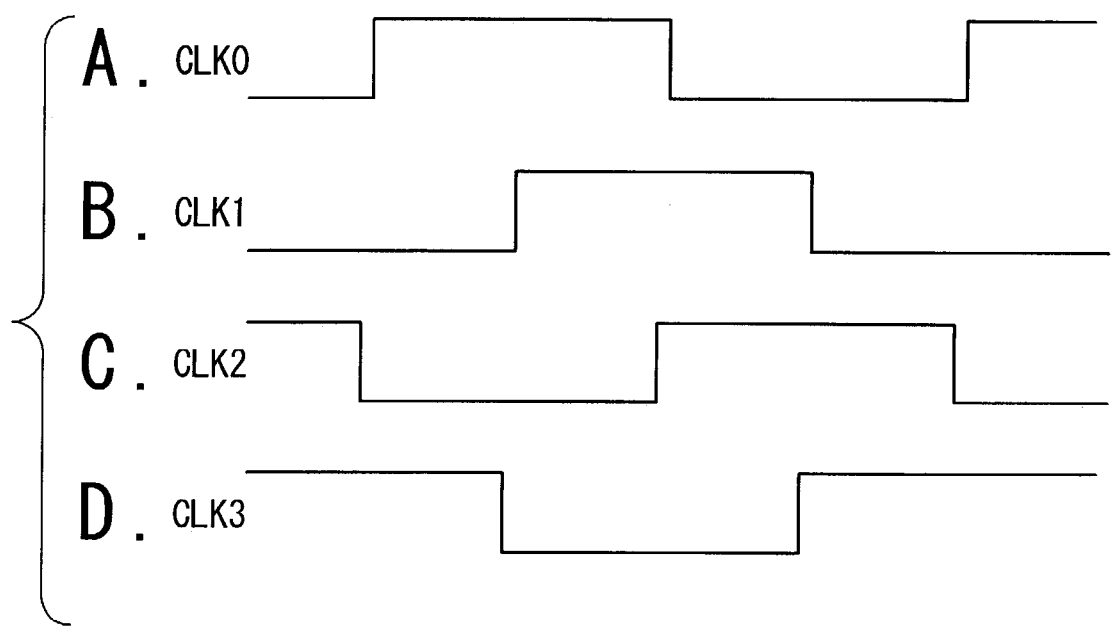
FIGS. 7A to 7D are timing charts showing an example of an input clock signal used in the demultiplexer apparatus according to the first embodiment of the present invention.

Next, FIG. 6 is a block diagram showing the circuit structure of the demultiplexer apparatus according to the first embodiment of the present invention. With reference to FIG. 6, four integrating circuits $10_1$ to $10_4$ are provided in parallel. On the input side, the four integrating circuits $10_1$ to $10_4$ are connected to a common node IN. The integrating circuits $10_2$ to $10_4$ and $10_1$ are connected to the outputs of the integrating circuits $10_1$ to $10_4$. Consequently, when the time series binary data is inputted, the integrating circuit refers to the output of the integrating circuit at the previous stage to carry out the 1:4 serial-to-parallel conversion. Parallel data $D_0$ to $D_3$ are outputted from the integrating circuits $10_1$ to $10_4$. It should be noted that the circuit structure shown in FIG. 6 is only intended to exemplify the present invention. In the present invention, the number of integrating circuits is not limited to 4. FIGS. 7A to 7D are the timing charts showing the operation of the demultiplexer apparatus according to the first embodiment of the present invention.

In FIG. 6, clock signals $CLK_0$ to $CLK_3$ of four phases are sent to the integrating circuits $10_1$ to $10_4$, respectively, and are different from one another by 90°, as shown in FIGS. 7A to 7D. The integrating circuits $10_1$ to $10_4$ read the time series binary data two bits by two bits. However, the data outputted to the integrating circuit of the post stage operating in the delay of 90°, is only the latter one of the two bits. In short, even if the input IN is 0-1 or 1-1, the output of the integrating circuit becomes 1. Also, even if the input IN is 1-0 or 0-0, the output of the integrating circuit becomes 0.

In FIG. 6, only the latter one bit of the two bits is sent to the next integrating circuit. However, in the present invention, this data is not limited to one bit. Also, in FIG. 6, each integrating circuit receives the data from only the integrating circuit of an immediately front stage. However, the present invention may be designed such that the data can be received from at least one integrating circuit other than the integrating circuit of the immediately front stage.

Figure 8:
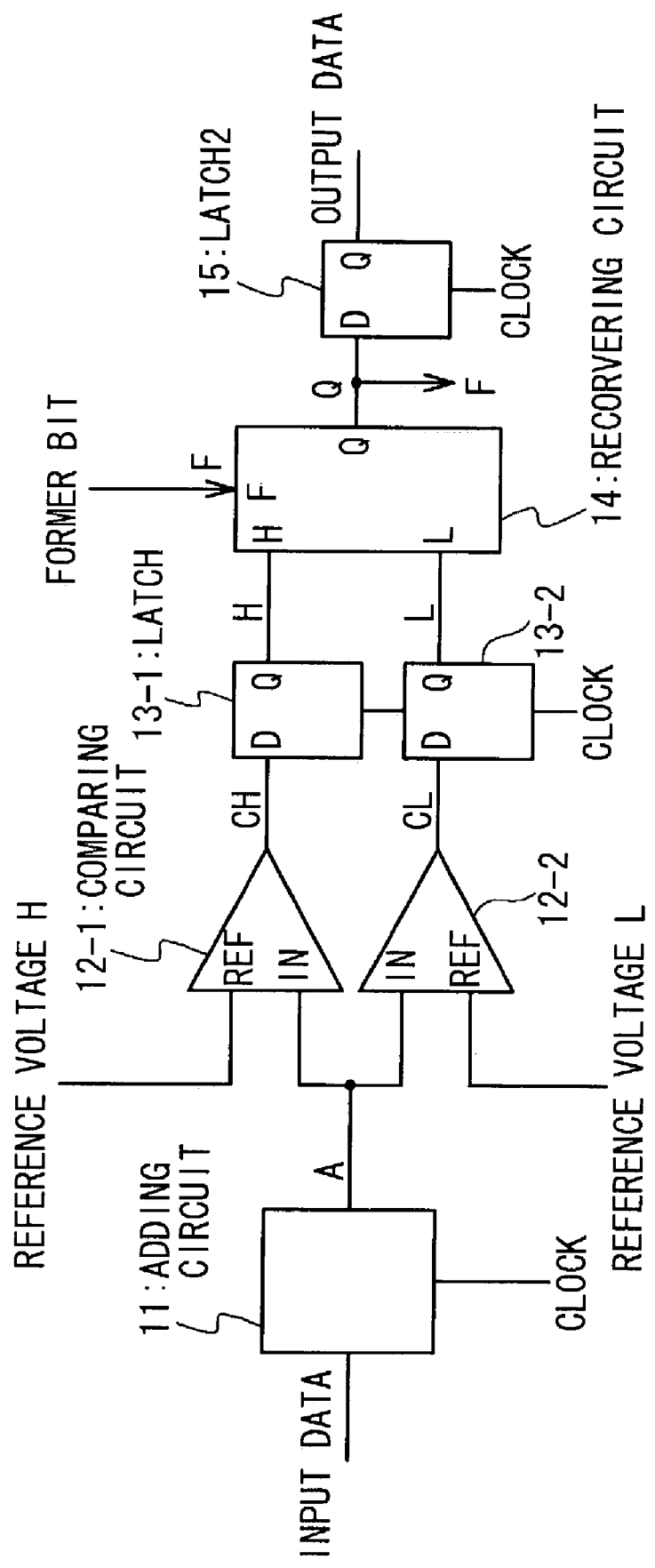
FIG. 8 is a block diagram showing the circuit structure of an integrating circuit used in the demultiplexer apparatus according to the first embodiment of the present invention.

Next, FIG. 8 is a block diagram showing the circuit structure of the integrating circuit 10 for one system shown in FIG. 6. FIGS. 9A to 9I are timing charts showing the timings indicative of the operation of the integrating circuit 10.

With reference to FIG. 8, the integrating circuit 10 includes an adding circuit 11, comparing circuits 12-1 and 12-2, latches 13-1 and 13-2 of D-type flip-flop, a recovering circuit 14, and a timing adjusting latch 15. The adding circuit 11 adds the input data. The comparing circuits 12 (12-1 and 12-2) use a reference voltage H and a reference voltage L and classify an addition result A of the adding circuit 11. The latches 13-1 and 13-2 latch the determined results of the comparing circuits 12-1 and 12-2 in synchronism with the clock signal. The recovering circuit 14 recovers the binary data using an output result F of the integrating circuit in the front stage and the outputs of the latches 13-1 and 13-2. The latch 15 latches the output of the recovering circuit 14 to output as an output data.

The operation of the integrating circuit will be described below with reference to FIGS. 9A to 9I.

Figure 9:
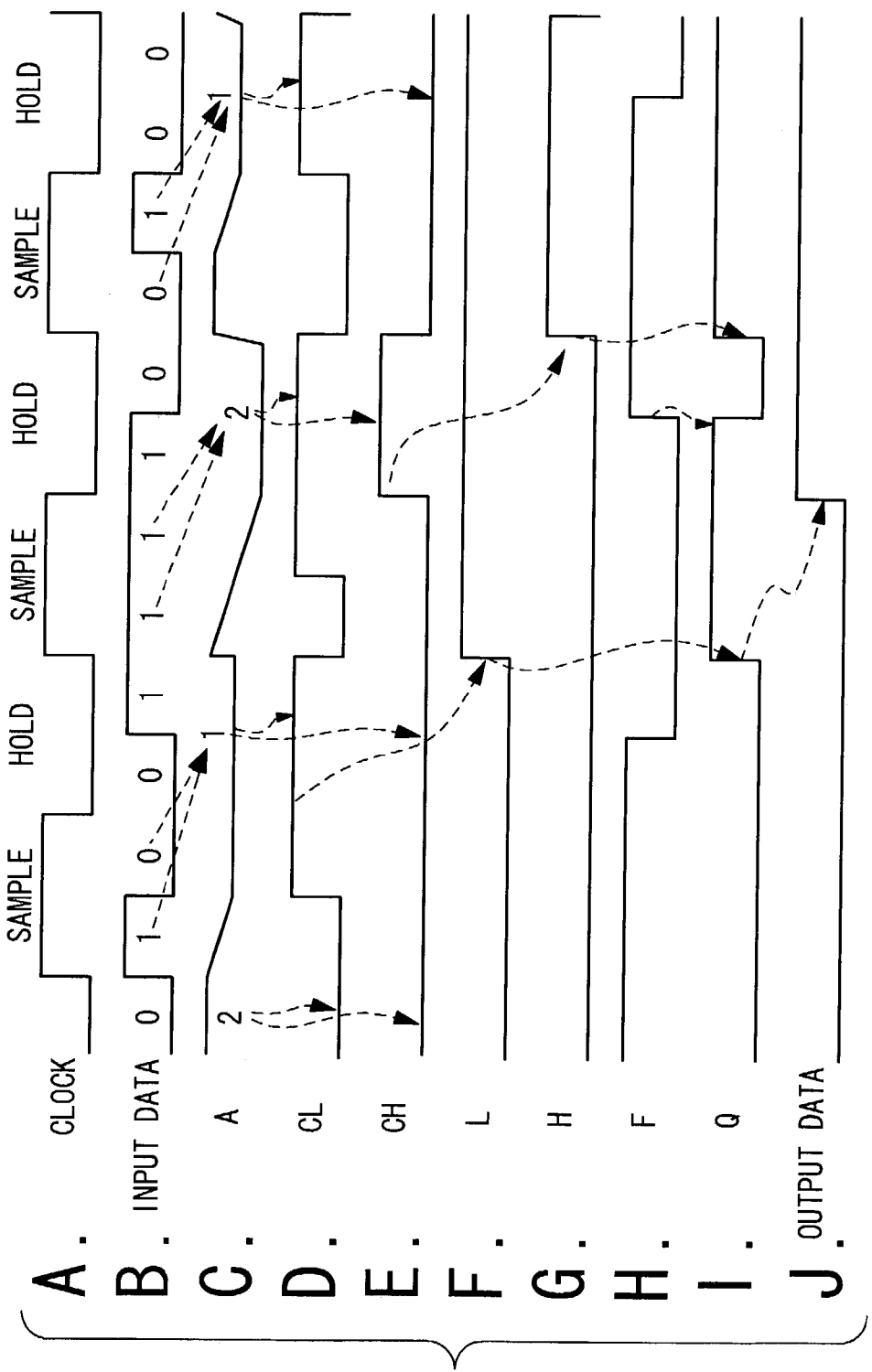
FIGS. 9A to 9J are timing charts showing an operation of the integrating circuit used in the demultiplexer apparatus according to the first embodiment of the present invention.

As shown in FIG. 9A, in a period while the clock signal is High (a sampling period), the input data for the two bits is integrated by the adding circuit 11. During a period while the clock signal is Low (a holding period), its data is held. Consequently, a trinary data is outputted to an output node A of the adding circuit 11 in correspondence to the two bits of the input data. The trinary data is 2 in case of the input two bits of 0-0, is 1 in case of the two bits of 0-1, is 1 in case of the two bits of 1-0, and is 0 in case of the two bits of 1-1. The trinary data is indicative of the value added after the two bits of the input data are inverted.

The multi-value data as the integration result A in the adding circuit 11 shown in FIG. 9C is compared with the two reference voltages High and Low by the comparing circuits 12-1 and 12-2, respectively, and two binary value data CH and CL are obtained. If a power supply voltage is assumed to be $V_{DD}$, the reference voltage H is equal to ⅓ of $V_{DD}$, and the reference voltage L is ⅔ of $V_{DD}$. In this way, the reference voltages are set to be voltages between the trinary data of 0 and 1 and between the trinary data of 1 and 2.

As shown in FIGS. 9D and 9E, the two binary data CH and CL as the outputs from the comparing circuits 12-1 and 12-2 become CH:CL=1:1, 0:1, 0:0, in correspondence to the trinary data of 0, 1 and 2 of the integration result A. The binary data CH and CL are latched by the latches 13-1 and 13-2 in synchronization with the input clock signal, and outputted as the outputs H and L from the latches 13-1 and 13-2 to the recovering circuit 14, as shown in FIGS. 9F and 9G.

The recovering circuit 14 uses the output H and L from the latches 13-1 and 13-2 and an output F from the front stage integrating circuit shown in FIG. 9H, and outputs a result Q shown in FIG. 9I, in accordance with the following truth table 2.

TABLE 2

| H | 1 | 0 | 0 | 0 |
|---|---|---|---|---|
| L | 1 | 0 | 1 | 1 |
| F | x | x | 0 | 1 |
| Q | 1 | 0 | 1 | 0 |

In FIG. 6, the output timings of the outputs D0 to D3 are not matched with no control, because the integrating circuits 101 to 104 are respectively operated in response to the clock signals CLK0 to CLK3 whose phases are different from one another. For this reason, in the circuit structure shown in FIG. 8, the latch 15 in the final stage of the integrating circuit is operated so as to adjust the timings of the outputs by changing a delay time for each integrating circuit. That is, the latch 15 is for a re-timing. It should be noted that in the tables 1 and 2, X designates "Don't Care".

Figure 10:
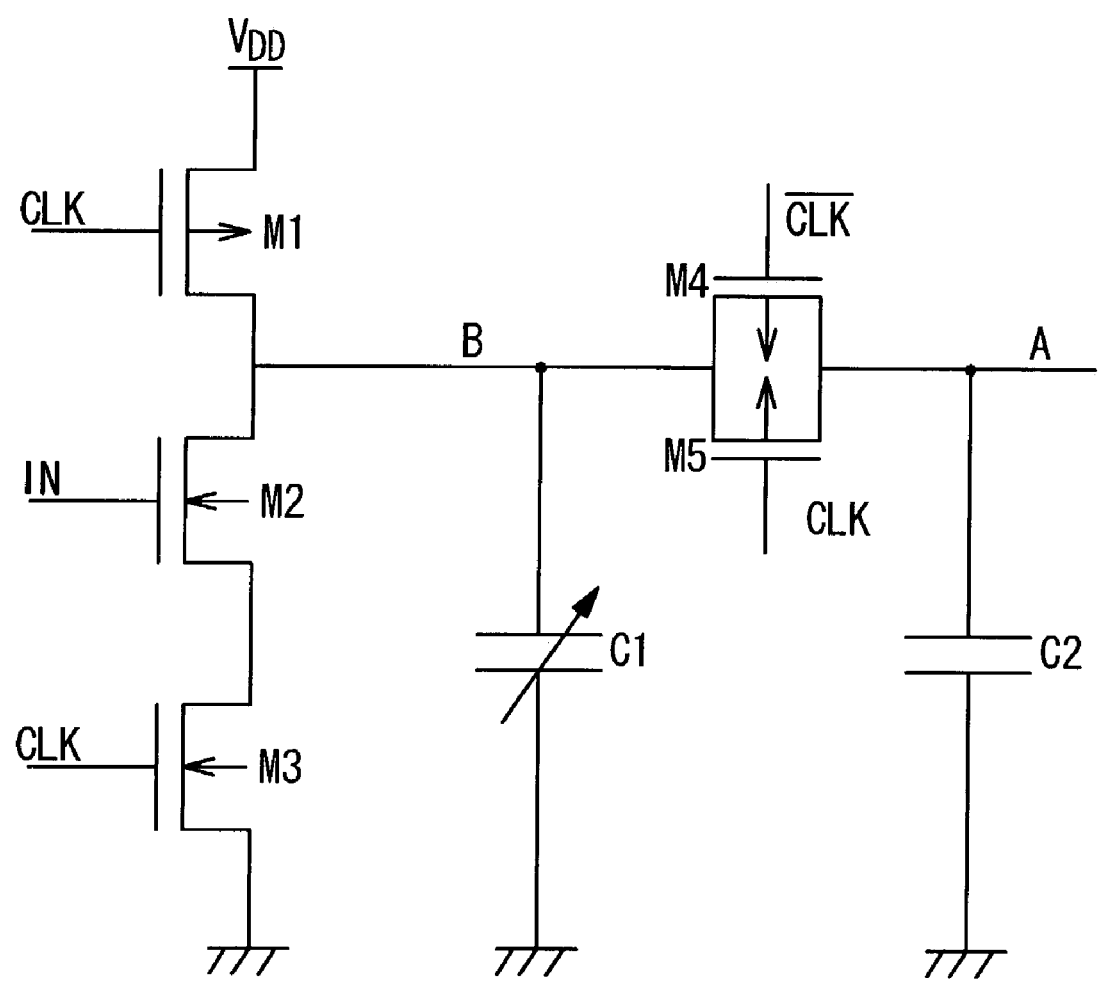
FIG. 10 is a circuit diagram showing the circuit structure of an adding circuit in the integrating circuit of the demultiplexer apparatus in the first embodiment.

FIG. 10 is a diagram showing an example of the circuit structure of the adding circuit 11. With reference to FIG. 10, the adding circuit 11 has a P-channel MOS transistor M1, an N-channel MOS transistor M2 and an N-channel MOS transistor M3, which are connected in series between a power supply $V_{DD}$ and a ground. A clock signal CLK is commonly inputted to gates of the MOS transistors M1 and M3, and an input data IN is inputted to a gate of the MOS transistor M2. A variable capacitor C1 is connected between the ground and a node B as a connection point between drains of the MOS transistors M1 and M2. A CMOS transfer switch composed of a P-channel MOS transistor M4 and an N-channel MOS transistor M5 is inserted between the node B and a node A. A complementary signal of the clock signal CLK and the clock signal CLK are inputted to gates of the transistors M4 and M5, respectively. A capacitor C2 is connected between the node A and the ground.

In a period while a pulse of the clock signal CLK is High, the N-channel MOS transistor M3 is turned on, and the transfer switch composed of the transistors M4 and M5 is turned on. Consequently, only during a period while the input data IN is High, the N-channel MOS transistor M2 is turned on, and charges are discharged from the capacitors C1 and C2.

A voltage of the capacitor C2 is held at the node A, since the transfer switches M4 and M5 are turned off during the period while the pulse of the clock signal CLK is Low. Also, the node B is charged up to the power supply $V_{DD}$ through the P-channel MOS transistor M1 that is turned on.

At the timing when a next pulse of the clock signal CLK becomes High, the charges in the capacitors C1 and C2 are re-distributed such that the voltages of the nodes A and B are equal. In this case, if the capacitance of the C2 is lower than that of the C1, the change in the voltage of the node B is smaller than the change in the voltage of the node A. Here, a time constant of the charging and discharging operations during the period while the pulse of the clock signal CLK is High is substantially determined based on the on-resistances of the N-channel MOS transistors M2 and M3 and the capacitance of the capacitor C1. This time constant needs to be changed based on the operational frequency, since the discharging operation must be completed in the time equal to a half of the cycle of the clock signal CLK. Thus, the capacitor C is made variable in order to make the time constant variable as mentioned above.

Figure 11:
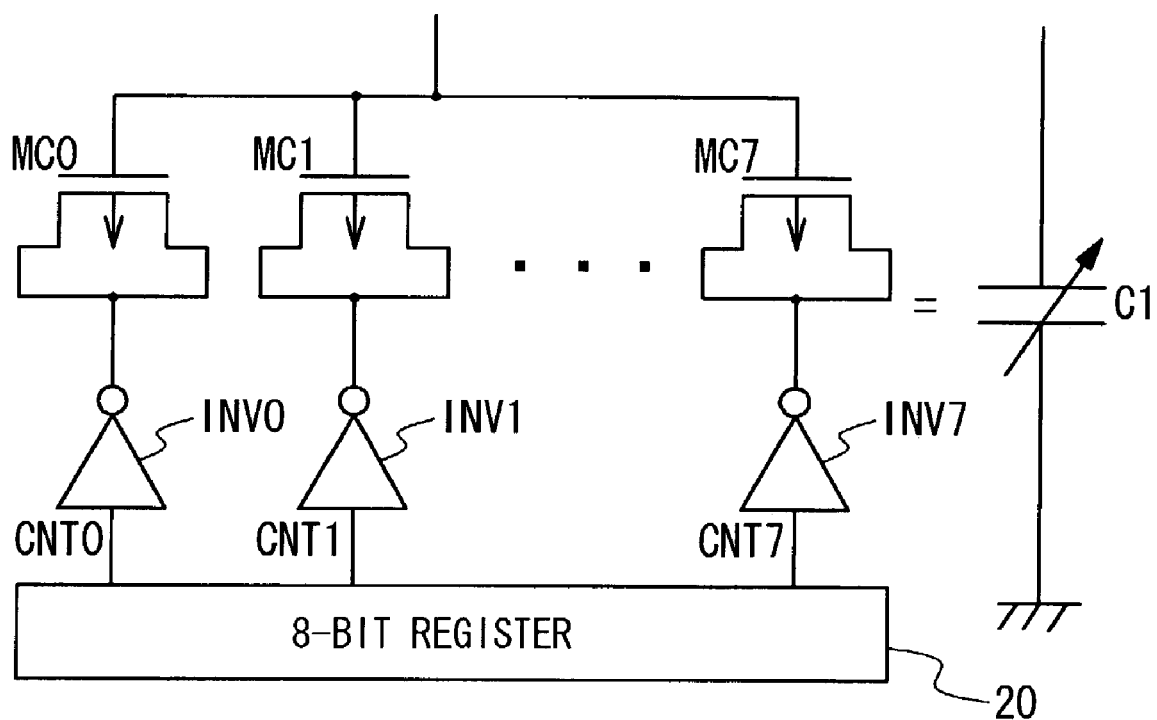
FIG. 11 is a circuit diagram showing the circuit structure of a variable capacitor of the adding circuit in the integrating circuit of the demultiplexer apparatus in the first embodiment.

FIG. 11 is a diagram showing an example of the circuit structure of the capacitor C1 shown in FIG. 10. With reference to FIG. 11, the variable capacitor is formed by connecting in parallel, eight MOS capacitors MC0 to MC7, which have different gate capacitances. The MOS capacitor $MC_i$ (i=0, 1, 2 to 7) has a high gate capacitance, since a channel is formed only when a control signal CNTi is Low. Thus, the capacitance value can be accurately controlled through the control of the control signals $CNT_0$ to $CNT_7$. The data held in an 8-bit register 20 on a chip represents the frequency of the clock signal, and the control signals $CNT_0$ to $CNT_7$ are determined based on the data held by the 8-bit register 20. Each of the signals obtained by inverting the data held by the register 20 by inverters INV0 to INV7 is commonly connected to a source and a drain of a corresponding one of the MOS capacitors MC0 to MC7.

FIGS. 12A to 12C are diagram showing an internal operational waveform of the adding circuit 11 in the demultiplexer apparatus in the first embodiment. They show the waveforms of the clock signal CLK, the input data IN and the charging and discharging current of the capacitor C1. By making the waveform of the clock signal CLK close to a sine wave from a rectangular wave as shown in FIG. 12A, the charging and discharging currents during the period while the input data IN is High are reduced at the first and final parts of the period while the clock signal CLK is High. Consequently, even if the timings of the signals of the clock signal CLK and the signal of the input data IN are shifted, the influence on the output result of the adding circuit is suppressed. In this way, it is possible to increase the operation margin for the timing shift.

Figure 13A:
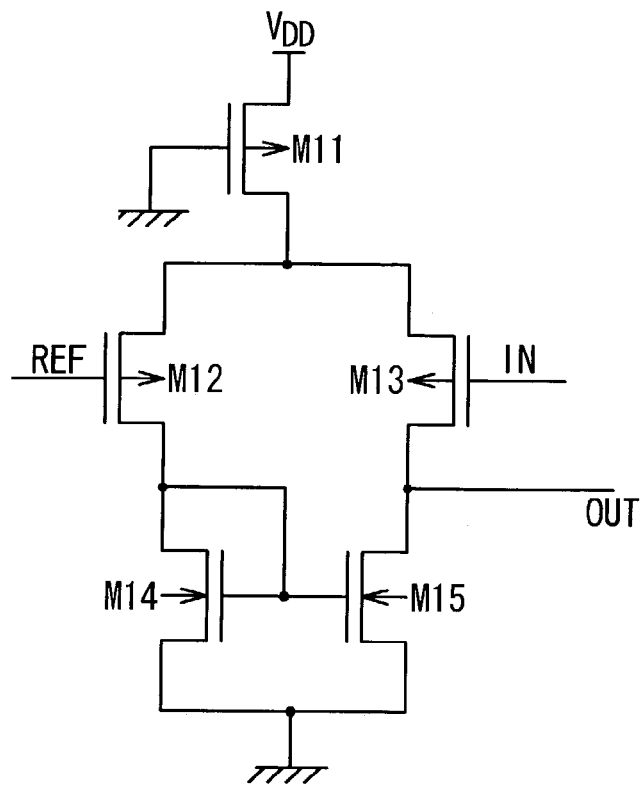
FIGS. 13A and 13B are circuit diagrams showing the circuit structure of a comparing circuit in the integrating circuit of the demultiplexer apparatus in the first embodiment.
Figure 13B:
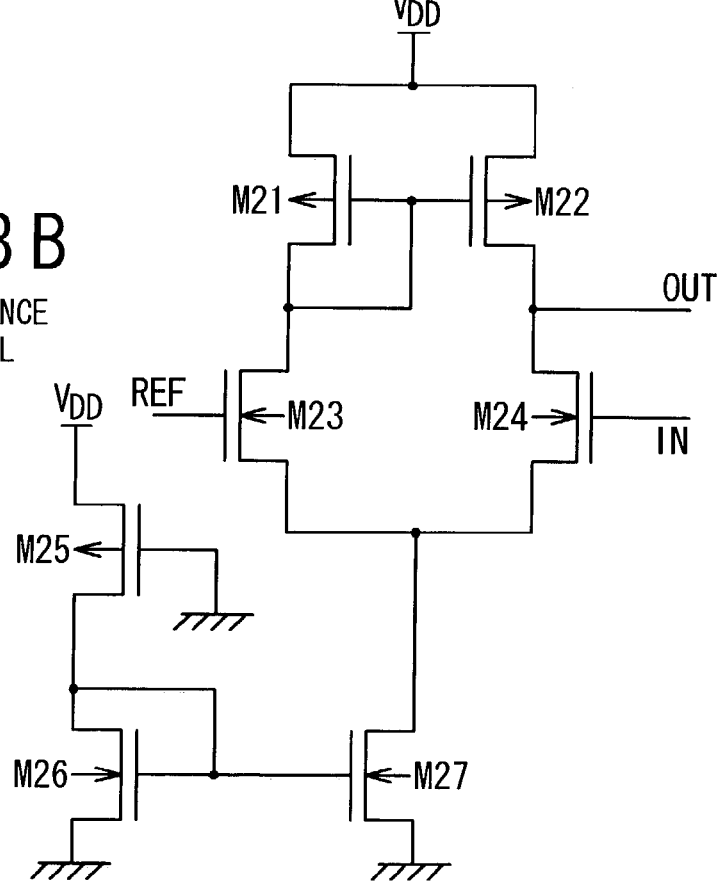

FIG. 13A is a block diagram showing the circuit structure of the comparing circuit 12-1 for the reference voltage H. FIG. 13B is a block diagram showing the circuit structure of the comparing circuit 12-2 for the reference voltage L. Consequently, the trinary values of 0, 1 and 2 are obtained from the output of the adding circuit 11.

With reference to FIG. 13A, the comparing circuit 12-1 is composed of a constant current source transistor M11 of a P-channel MOS transistor, a differential pair of transistors composed of P-channel MOS transistors M12 and M13, and a differential circuit composed of N-channel MOS transistors M14 and M15. In the P-channel MOS transistor M11, a source is connected to the power supply $V_{DD}$, and a gate is connected to the ground. In the differential pair of transistors M12 and M13, sources are commonly connected to a drain of the constant current source transistor M11, and gates are connected to a reference voltage REF (the reference voltage H in FIG. 8) and the input data IN, respectively. The N-channel MOS transistors M14 and M15, which constitute a current mirror circuit, are connected to drains of the differential pair of transistors M12 and M13, respectively. Thus, they function as an active load. An output OUT is taken out from the drain of the N-channel MOS transistor M15. When a voltage of the input data IN is lower than the reference voltage REF, the output OUT becomes at a High level.

With reference to FIG. 13B, the comparing circuit 12-2 is composed of a constant current source transistor M27 of an N-channel MOS transistor, N-channel MOS transistors M23 and M24 serving as a differential pair of transistors, and a differential circuit composed of P-channel MOS transistors M21 and M22. In the constant current source transistor M27, a source is grounded. In the N-channel MOS transistors M23 and M24, sources are commonly connected to the drain of the constant current source transistor M27, and gates are connected to a reference voltage REF (the reference voltage L in FIG. 8) and the input data IN, respectively. The P-channel MOS transistors M21 and M22, which constitute a current mirror circuit, are connected to drains of the differential pair of transistors, respectively. Thus, they function as an active load. An output is taken out from a drain of the P-channel MOS transistor M22. The comparing circuit 12-2 further has a transistor M26, which constitutes the current mirror circuit together with the constant current source transistor M27, and a P-channel MOS transistor M25 inserted between a drain of the transistor M26 and the power supply. A gate of the P-channel MOS transistor M25 is grounded. The constant current source transistor M27 drives the differential pair of transistors M23 and M24 through a mirror current as a drain current of the P-channel MOS transistor M25. When a voltage of the input data IN is lower than the reference voltage REF, the output OUT becomes at a High level.

Figure 14A:
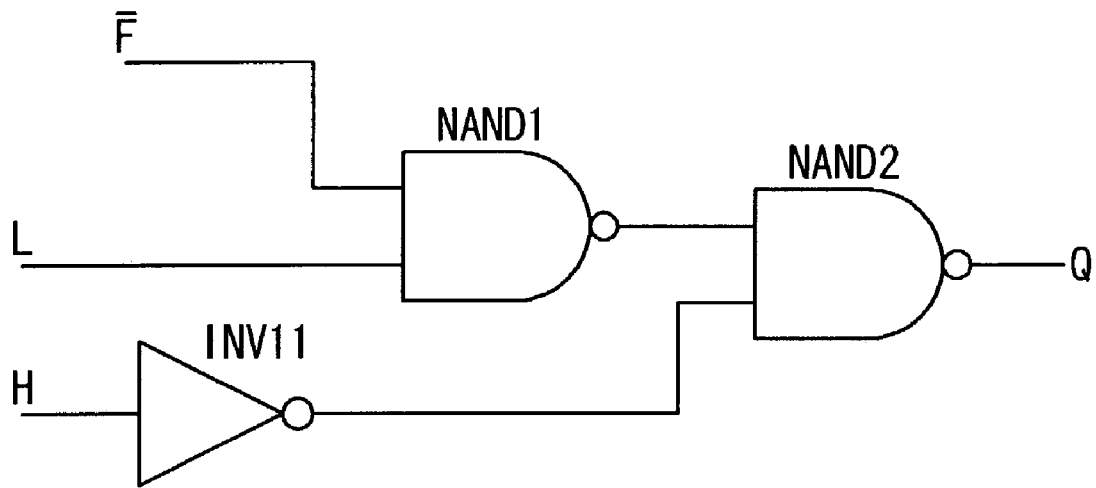
FIGS. 14A and 14B are circuit diagrams showing the circuit structure of a recovering circuit in the integrating circuit of the demultiplexer apparatus in the first embodiment.
Figure 14B:
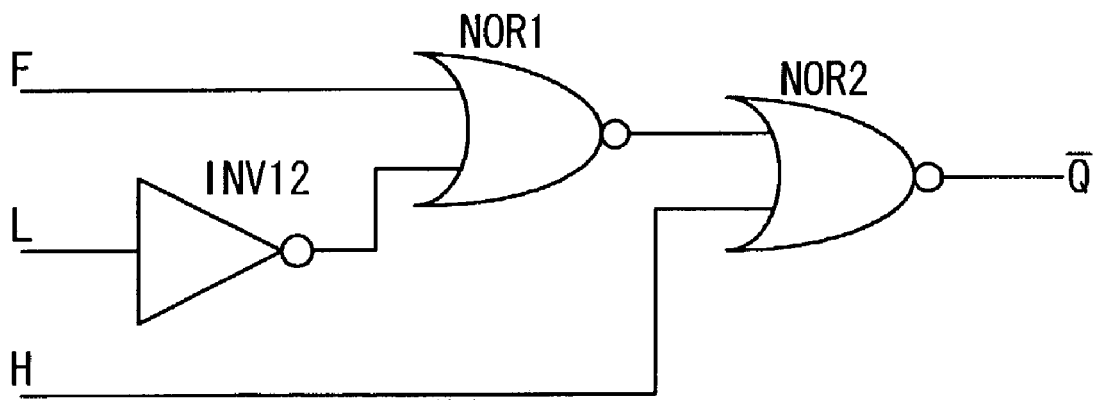

FIGS. 14A and 14B are circuit diagrams showing the circuit structure of the recovering circuit 14 in the demultiplexer apparatus of the first embodiment. The recovering circuit 14 attains the truth table shown in the table 2. The recovering circuit 14 uses different circuits to even-numbered bits D0 and D2 and odd-numbered bits D1 and D3. With reference to FIG. 14A, the circuit portion of the recovering circuit for the even-numbered bits is composed of a NAND circuit NAND1 for receiving an inversion signal of the output F from the previous stage integrating circuit and the output L of the latch 13-2, and a NAND circuit NAND2 for receiving an output of the NAND1 and a signal obtained by inverting the output H from the latch 13-1 by the inverter INV11.

Also, with reference to FIG. 14B, the circuit portion of the recovering circuit for the odd-numbered bits is composed of a NOR circuit NOR1 for receiving the output F from the previous stage integrating circuit and a signal obtained by inverting the output L from the latch 13-2 by the inverter INV12, and a NOR circuit NOR2 for receiving an output of the NOR1 and the output H from the latch 13-1.

The integrating circuits 101 to 104 for the bits D0 to D3 are operated at the phases shifted by the quarter clock signal (90°) from one another. Thus, the time from the input of the output F from the previous stage integrating circuit to the output of the output data Q needs to be equal to or less than the period of the quarter clock signal. For this reason, the optimization of the logic is carried out in order to reduce the number of gate stages in the integrating circuit, as shown in FIGS. 14A and 14B. As a result, the different circuits are used for the even-number bits and the odd-numbered bits.

Figure 15:
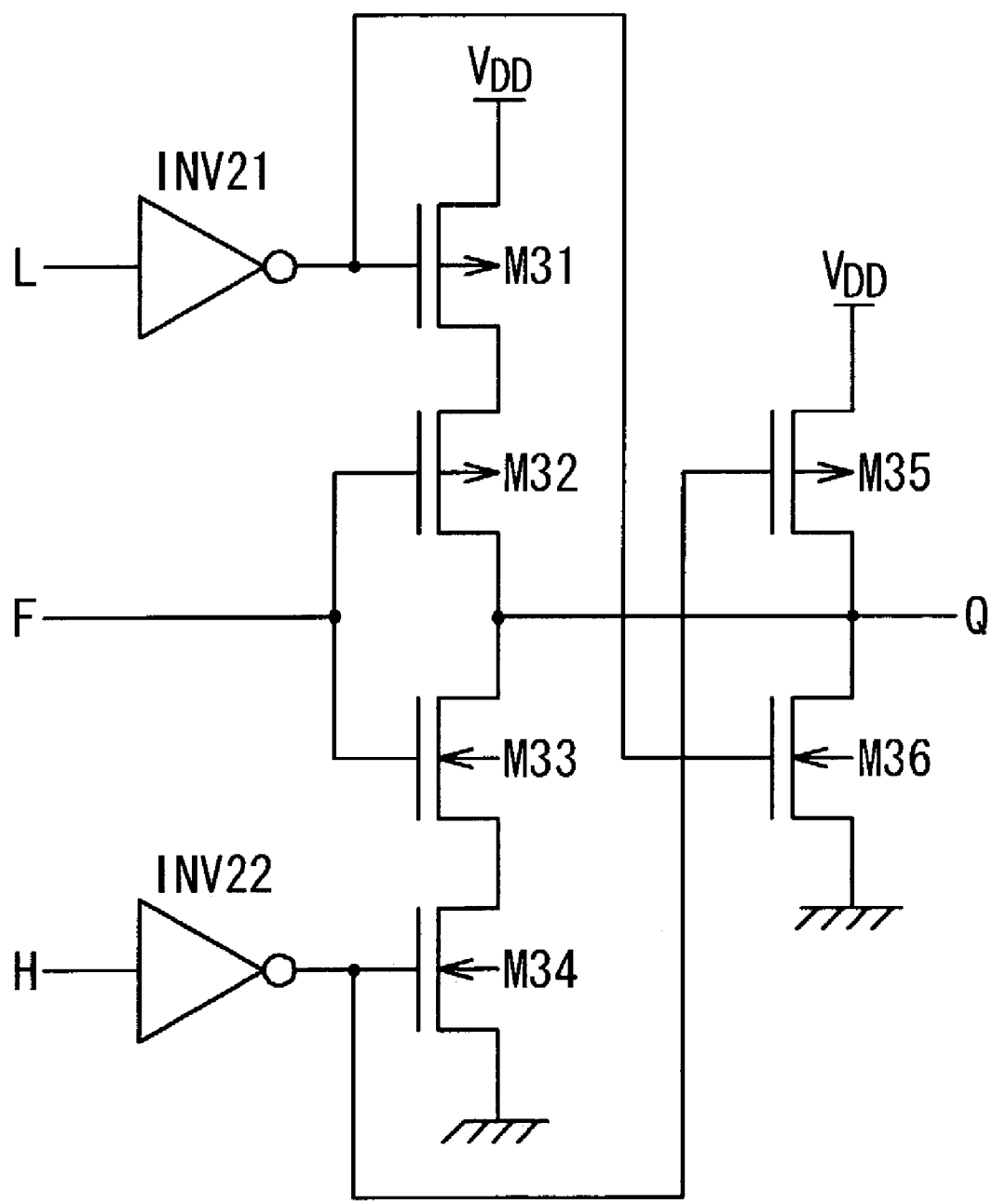
FIG. 15 is a circuit diagram showing another example of the circuit structure of the recovering circuit in the integrating circuit of the demultiplexer apparatus in the first embodiment.

FIG. 15 is a circuit diagram showing another circuit structure example of the recovering circuit 14 used in the demultiplexer apparatus of the first embodiment. In this circuit structure example, the same circuits are used for the even-numbered and odd-numbered bits. The recovering circuit 14 is composed of P-channel MOS transistors M31 and M32, N-channel MOS transistors M33 and M34 and inverters INV21 and INV22. The transistors M31 to M34 are connected in series between the power supply and the ground. A signal obtained by inverting the output L by the inverter INV21 is sent to a gate of the transistor M31, and the output F is sent to gates of the transistors M32 and M33. A signal obtained by inverting the output H by the inverter INV22 is sent to a gate of the transistor M34. The above-mentioned circuit structure example is further composed of a P-channel MOS transistor M35 and an N-channel MOS transistor M36, which are connected in series between the power supply and the ground. A signal obtained by inverting the output H by the inverter INV22 is sent to a gate of the transistor M35, and a signal obtained by inverting the output L by the inverter INV21 is sent to a gate of the transistor M36. A connection point between drains of the P-channel MOS transistor M32 and the N-channel MOS transistor M33 is connected to a connection point between drains of the P-channel MOS transistor M35 and the N-channel MOS transistor M36, and an output Q is outputted from that connection point. The output Q is outputted as an output F to a next stage.

As mentioned above, the demultiplexer apparatus in the first embodiment of the present invention has the first to N-th integrating circuits which commonly receive the input binary data. The first to N-th integrating circuits are driven on the basis of the first to N-th clocks whose phases are different from one another. Also, the (i+1)-th (i=a positive integer from 1 to N−1) integrating circuit refers to the i-th integrating circuit that is the integrating circuit in the previous stage of the integrating circuit (However, if i=N, the (N+1)-th integrating circuit becomes the first integrating circuit, and the first integrating circuit refers to the output of the N-th integrating circuit). The (i+1)-th integrating circuit may refer to the integrating circuits at the previous stage of the (i+1)-th integrating circuit, namely, the integrating circuits before the i-th integrating circuit, namely, the (i−1)-th, (i−2)-th . . . , integrating circuits other than the i-th integrating circuit. The phase of the clock sent to this integrating circuit is delayed for one bit data than that of the clock sent to the integrating circuit at the previous stage of the (i+1)-th integrating circuit. Each of the integrating circuits has an adding circuit 11 for adding the input binary data in a plurality of bits. The comparing circuit 12 compares the multi-value data as the added result by the adding circuit 11 with the reference voltage, and generates a plurality of binary data. The recovering circuit 14 recovers the original binary data from the plurality of binary data outputted by the comparing circuit 12 and the output result F of the previous stage integrating circuit. The output from the recovering circuit 14 is latched by the latch 15 and then outputted after the timing is adjusted.

Next, the integrating circuit according to the second embodiment of the present invention will be described below.

Figure 16:
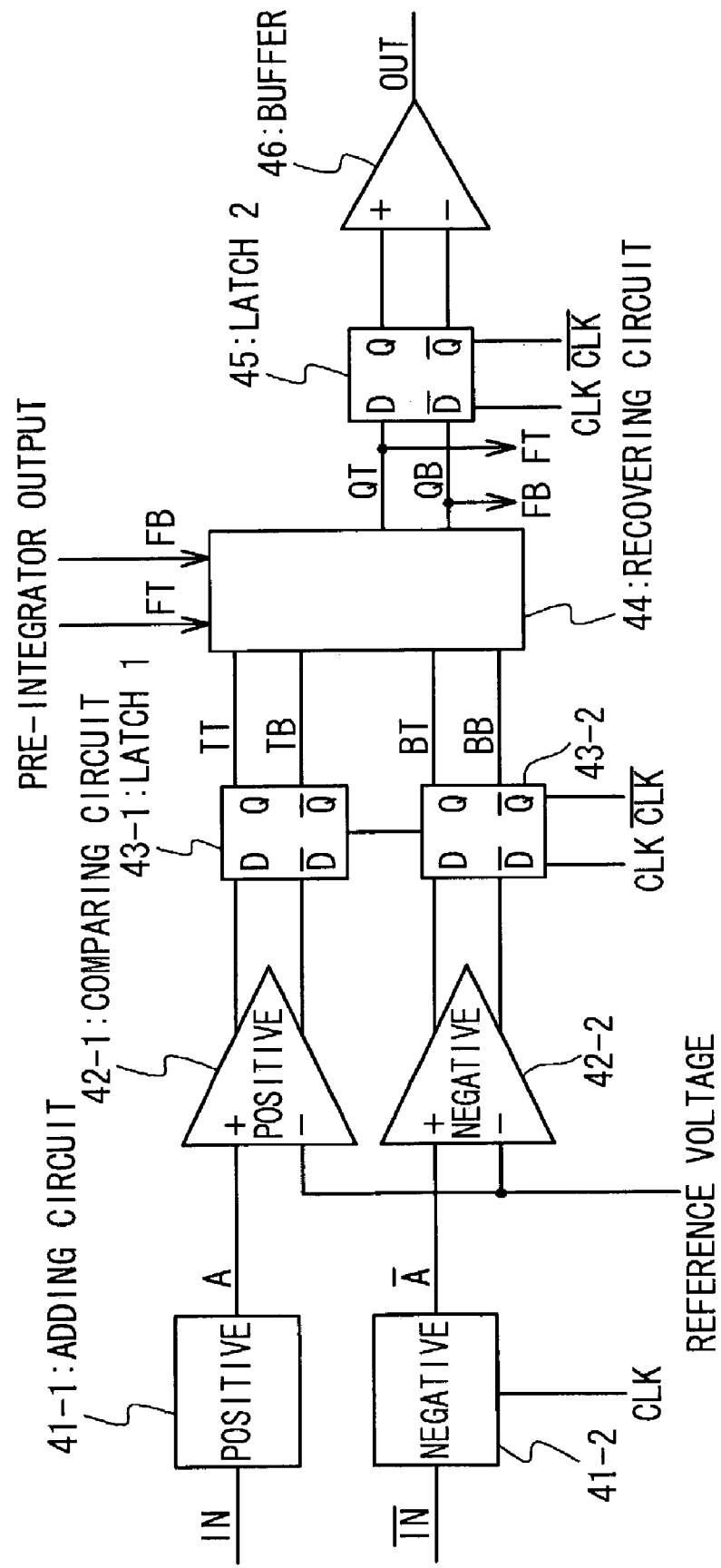
FIG. 16 is a block diagram showing the circuit structure of an integrating circuit of a demultiplexer apparatus according to a second embodiment of the present invention.

FIG. 16 is a diagram showing the circuit structure of the integrating circuit according to the second embodiment of the present invention. With reference to FIG. 16, the integrating circuit in the second embodiment is composed of two adding circuits, namely, plus and negative adding circuits 41-1, 41-2. The positive adding circuit 41-1 adds the input signals and generates the multi-value data of 0, 1 and 2. The negative adding circuit 41-2 adds the input signals and generates the multi-value data of the polarity opposite to the addition result of the positive adding circuit 41-1. In the multi-value data of the opposite polarity, 0 of the plus polarity corresponds to 2, and 2 of the plus polarity corresponds to 0. The multi-value data output from the positive and negative adding circuits 41-1 and 41-2 obtained as mentioned above are as illustrated in the following table 3.

TABLE 3

| input data | 0-0 | 0-1 | 1-0 | 1-1 |
|---|---|---|---|---|
| positive adding circuit | 0 | 1 | 1 | 2 |
| negative adding circuit | 2 | 1 | 1 | 0 |

The multi-value data of the addition result is any of the trinary data of 0, 1 and 2. This trinary data is compared with one reference voltage set to the voltage between 1 and 0. Then, the binary data is obtained from the two comparing circuits 42-1 and 42-2. The following table 4 illustrates and lists the outputs of the plus comparing circuit and the minus comparing circuit in this embodiment.

TABLE 4

| input data | 0-0 | 0-1 | 1-0 | 1-1 |
|---|---|---|---|---|
| plus comparing circuit | 0 | 1 | 1 | 1 |
| minus comparing circuit | 1 | 1 | 1 | 0 |

Though the use of the output of this comparing circuit and the output of the integrating circuit of the previous stage, the data can be recovered as illustrated in the following table 5.

TABLE 5

| output of pre-stage integrating circuit (FT) | x | x | 0 | 1 |
|---|---|---|---|---|
| plus output of plus comparing circuit (TT) | 0 | 1 | 1 | 1 |
| minus output of minus comparing circuit (TT) | 1 | 0 | 1 | 1 |
| recovered data (OUT) | 0 | 1 | 1 | 0 |

Figure 17:
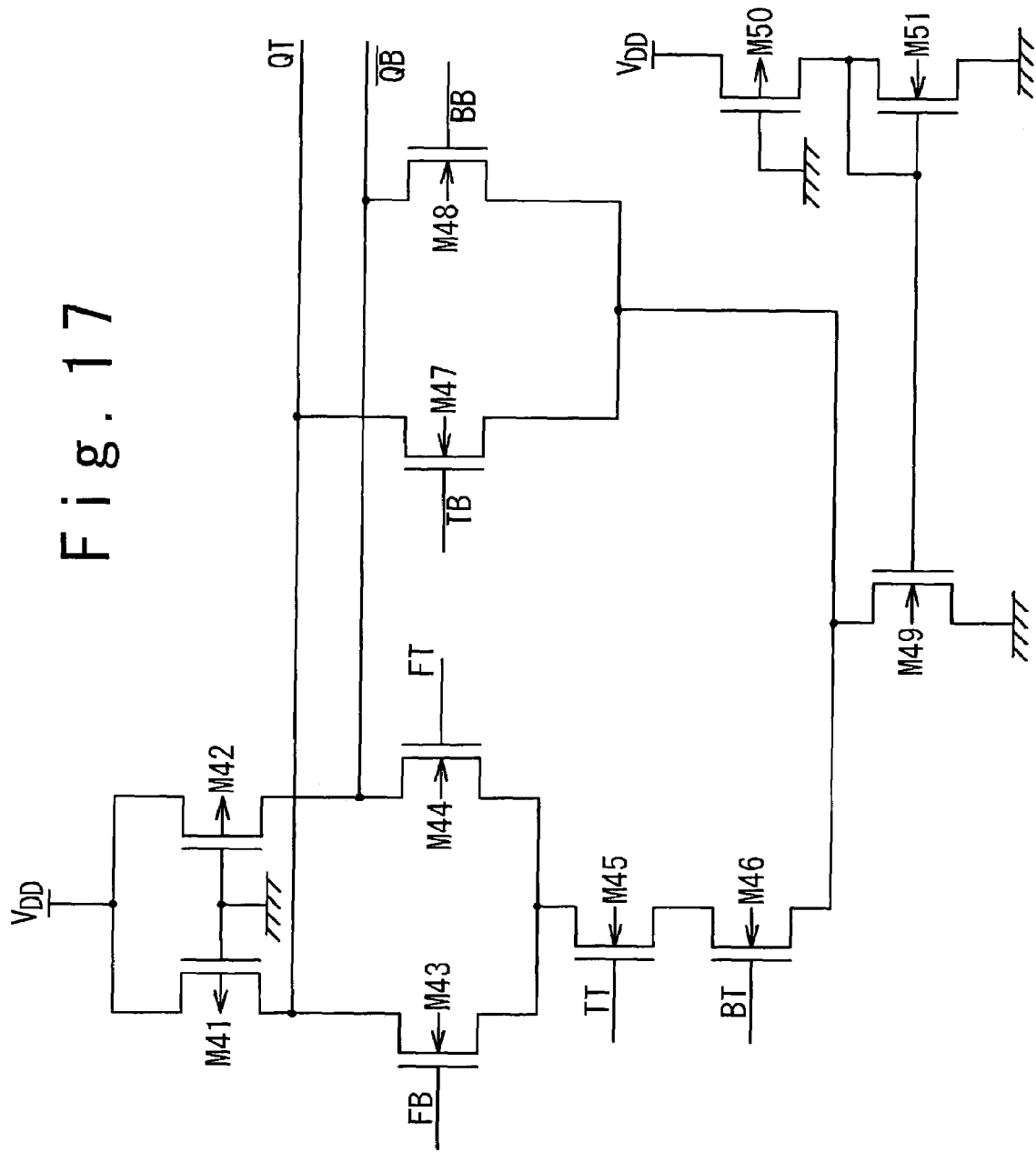
FIG. 17 is a block diagram showing the circuit structure of a recovering circuit in the integrating circuit of the demultiplexer apparatus according to the second embodiment of the present invention.

FIG. 17 is a diagram showing an example of the circuit structure of a recovering circuit 44 to attain the determination table in the table 5. The recovering circuit 44 is composed of a differential pair of transistors M43 and M44 composed of N-channel MOS transistors, P-channel MOS transistors M41 and M42, an N-channel MOS transistor M45, an N-channel MOS transistor M46, a differential pair of transistors M47 and M48 composed of N-channel MOS transistors, and a constant current source transistor M49 composed of an N-channel MOS transistor. In the differential pair of transistors M43 and M44, sources are commonly connected, and complementary output signals FB and FT of the previous stage integrating circuit are sent to the gates. The P-channel MOS transistors M41 and M42 constitute the active loads of the differential pair of transistors M43 and M44. In the N-channel MOS transistor M45, a drain is connected to the common source of the differential pair of transistors M43 and M44, and a plus output TT of the plus comparing circuit is connected to a gate. In the N-channel MOS transistor M46, a drain is connected to a source of the transistor M45, and a plus output BT of the minus comparing circuit is connected to a gate. In the differential pair of transistors M47 and M48, drains are connected to the drains of the differential pair of transistors M43 and M44, respectively, and sources are commonly connected, and a minus output TB of the plus comparing circuit and a minus output BB of the minus comparing circuit are connected to gates, respectively. In the constant current source transistor M49, a drain is connected to the source of the transistor M46 and the common source of the differential pair of transistors M47 and M48, and a source is grounded. The recovering circuit 44 is further composed of an N-channel MOS transistor M51 and a P-channel MOS transistor M50 provided between a drain of the transistor M51 and the power supply. A gate of the P-channel MOS transistor M50 and a source of the N-channel MOS transistor M51 are grounded. A gate of the constant current source transistor M49 is connected to a gate and a drain of the N-channel MOS transistor M51. Thus, the transistor M49 constitutes a current mirror circuit together with the N-channel MOS transistor M51. The transistors M43, M44, M45, M46, M47 and M48 are driven by the mirror current of the drain current of the P-channel MOS transistor M50.

Figure 18:
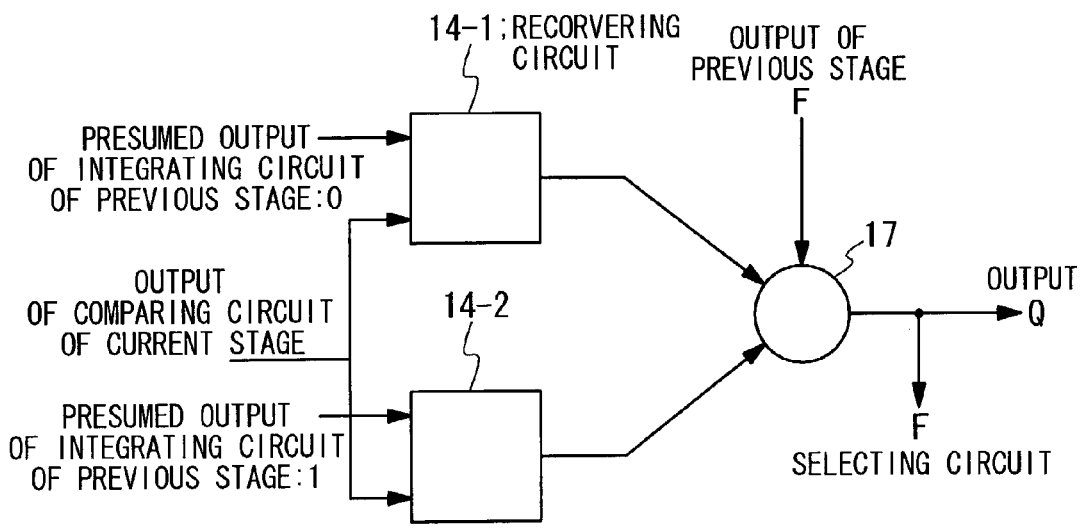
FIG. 18 is a block diagram showing the circuit structure of a recovering circuit in an integrating circuit of the demultiplexer apparatus according to a third embodiment of the present invention.

FIG. 18 is a diagram showing the circuit structure of a demultiplexer apparatus according to the third embodiment of the present invention. With reference to FIG. 18, two recovering circuits 14-1 and 14-2 are provided for a one-system integrating circuit. The recovering circuits 14-1 and 14-2 recover the data under the presumption that the output F at the previous stage integrating circuit is 0 or 1. Then, at the time when the output of the previous stage integrating circuit is actually determined, a selecting circuit 17 selects an output of the recovering circuit 14-1 if the output of the previous stage integrating circuit is 0, and outputs the recovery data. If the output of the previous stage integrating circuit is 1, the selecting circuit 17 selects an output of the recovering circuit 14-2 and outputs the recovery data Q. Consequently, it is possible to shorten the time from the determination of the output of the previous stage integrating circuit to the determination of the self-output. Also, the recovery data Q is sent as the output F to an integrating circuit at a next stage.

Figure 19:
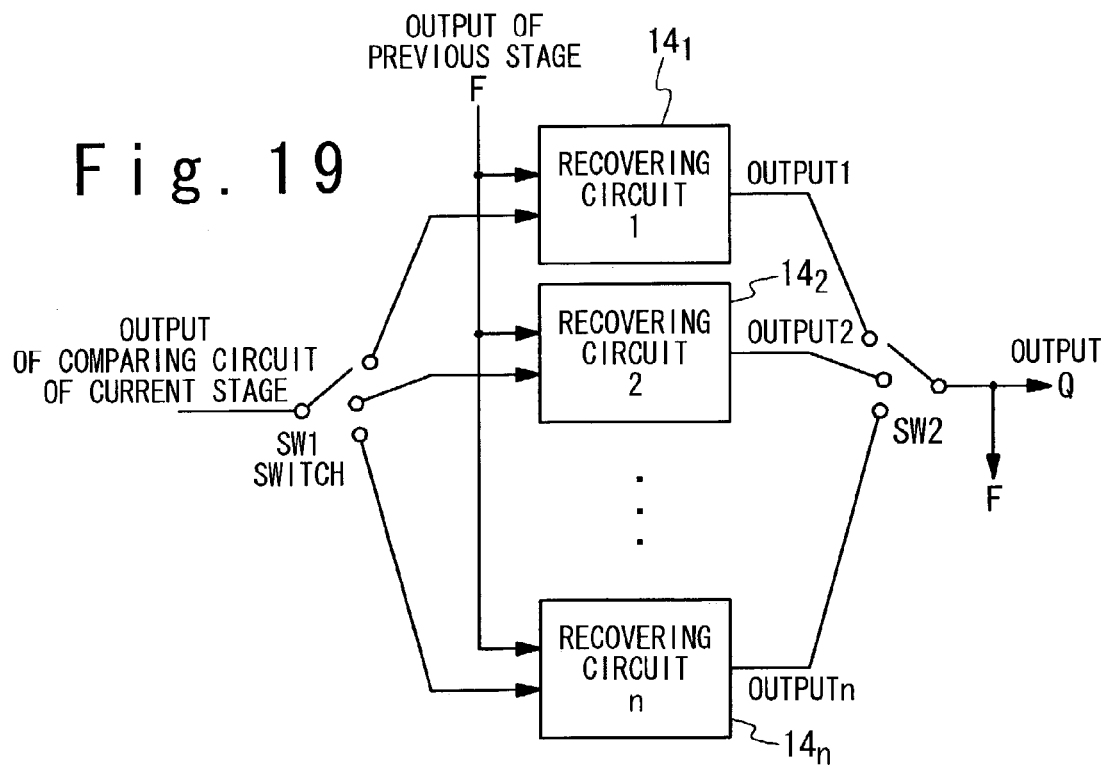
FIG. 19 is a block diagram showing the circuit structure of a recovering circuit in an integrating circuit of the demultiplexer apparatus according to a fourth embodiment of the present invention.

FIG. 19 is a diagram showing the circuit structure of a demultiplexer apparatus according to the fourth embodiment of the present invention. With reference to FIG. 19, in an integrating circuit in the fourth embodiment, n recovering circuits $14_1$ to $14_n$ are provided for a one-system integrating circuit. The recovering circuit to be used is switched in turn by a switch SW1, for each adding operation in the integrating circuit. Consequently, a period in which one recovering circuit can be used to recover the data is made longer to a time corresponding to n adding operations. Thus, a margin can be given to the timing of the recovering circuit. Also, one of outputs from the n recovering circuits $14_1$ to $14_n$ is selected by a switch SW2 and outputted as an output Q.

Figure 20:
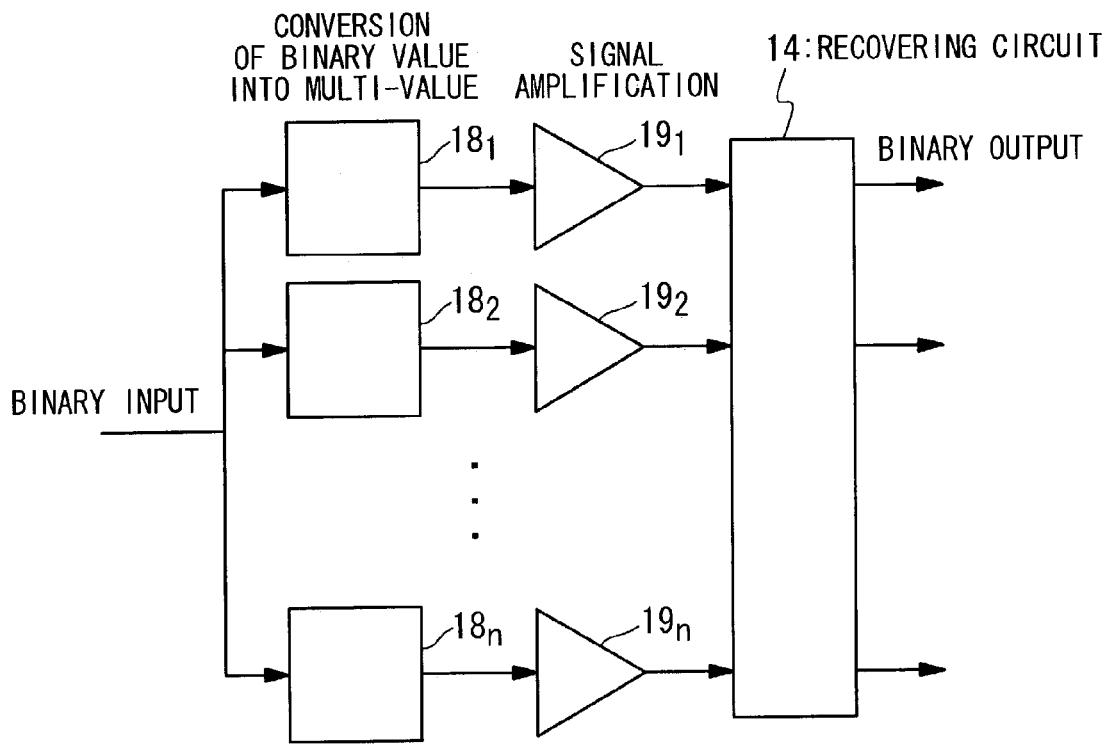
FIG. 20 is a block diagram showing the circuit structure of an integrating circuit of the demultiplexer apparatus according to a fifth embodiment of the present invention.

FIG. 20 is a diagram showing the circuit structure of a demultiplexer apparatus according to the fifth embodiment of the present invention. With reference to FIG. 20, the demultiplexer apparatus in the fifth embodiment is composed of binary to multi-value data converters $18_1$ to $18_2$ for converting the input binary data into the multi-value data, signal amplifiers $19_1$ to $19_n$ for amplifying the outputs of the binary to multi-value data converters $18_1$ to $18_2$, and a recovering circuit 14 for recovering the binary data from outputs of the signal amplifiers $19_1$ to $19_n$. If the data recovery is performed on a small input signal, at first, the conversion into the multi-value data is carried out at a stage of the small input signal, as shown in FIG. 20. The generated multi-value data has only frequency components equal to or less than a half of the input binary data. Thus, the frequency band necessary for the following amplifiers $19_1$ to $19_n$ and the like can be made narrower. In this embodiment, the circuit for referring to the different integrating circuits is assembled in the recovering circuit 14.

Figure 21:
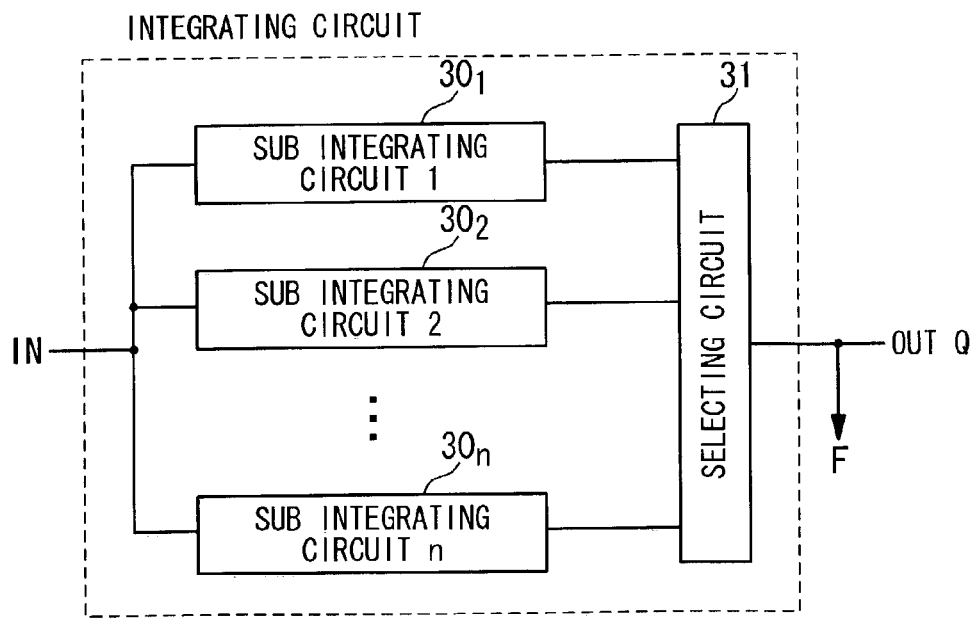
FIG. 21 is a block diagram showing the circuit structure of an integrating circuit of the demultiplexer apparatus according to a sixth embodiment of the present invention.
Figure 22:
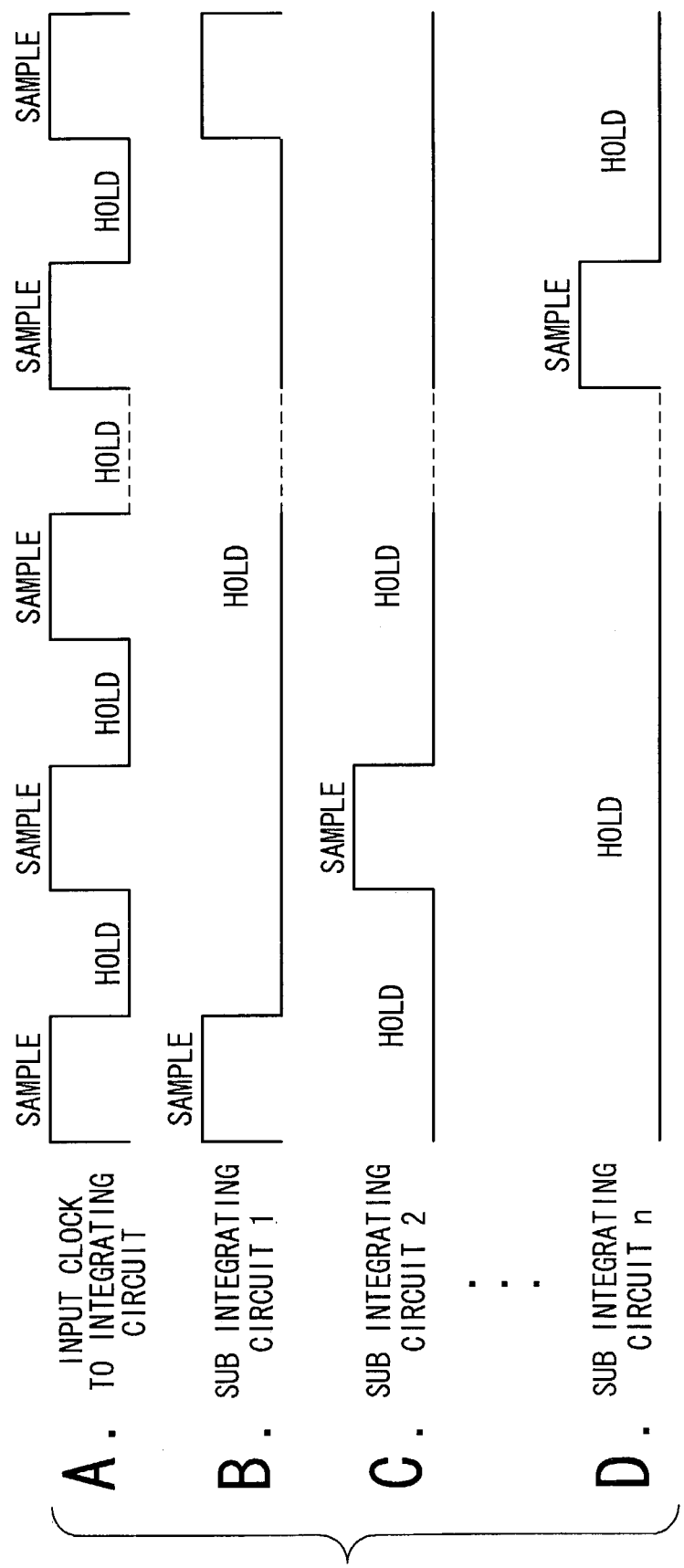
FIGS. 22A to 22D are timing charts showing an operation of the integrating circuit of the demultiplexer apparatus according to the sixth embodiment of the present invention.

FIG. 21 is a diagram showing the circuit structure of a demultiplexer apparatus according to the sixth embodiment of the present invention. With reference to FIG. 21, an integrating circuit in the sixth embodiment is composed of n sub-integrating circuits $30_1$ to $30_n$ and a selecting circuit 31 for selecting and outputting one of the outputs of the respective sub-integrating circuits. Each of the sub-integrating circuits has the circuit structure similar to the integrating circuit shown in FIG. 6, and is compose of the adding circuit, the comparing circuit, the recovering circuit and the like.

FIGS. 22A to 22D are timing charts showing the timings in the operation of the demultiplexer apparatus in the sixth embodiment shown in FIG. 21 of the present invention.

With reference to FIG. 18, the n timing signals are generated from the clock signals inputted to the integrating circuits of FIG. 21, and a sampling period is allocated to a different sub-integrating circuit for every sampling time. At this time, the other (n−1) sub-integrating circuits to which the sampling period is not allocated are at the holding period in which the input data is held and recovered. The selecting circuit 31 selects and outputs only one from the outputs of the sub-integrating circuits. Thus, the sub-integrating circuit can have the holding period longer the sampling time. Therefore, the long time can be used for recovering the input data so that the margin can be given to the timing.

Figure 23:
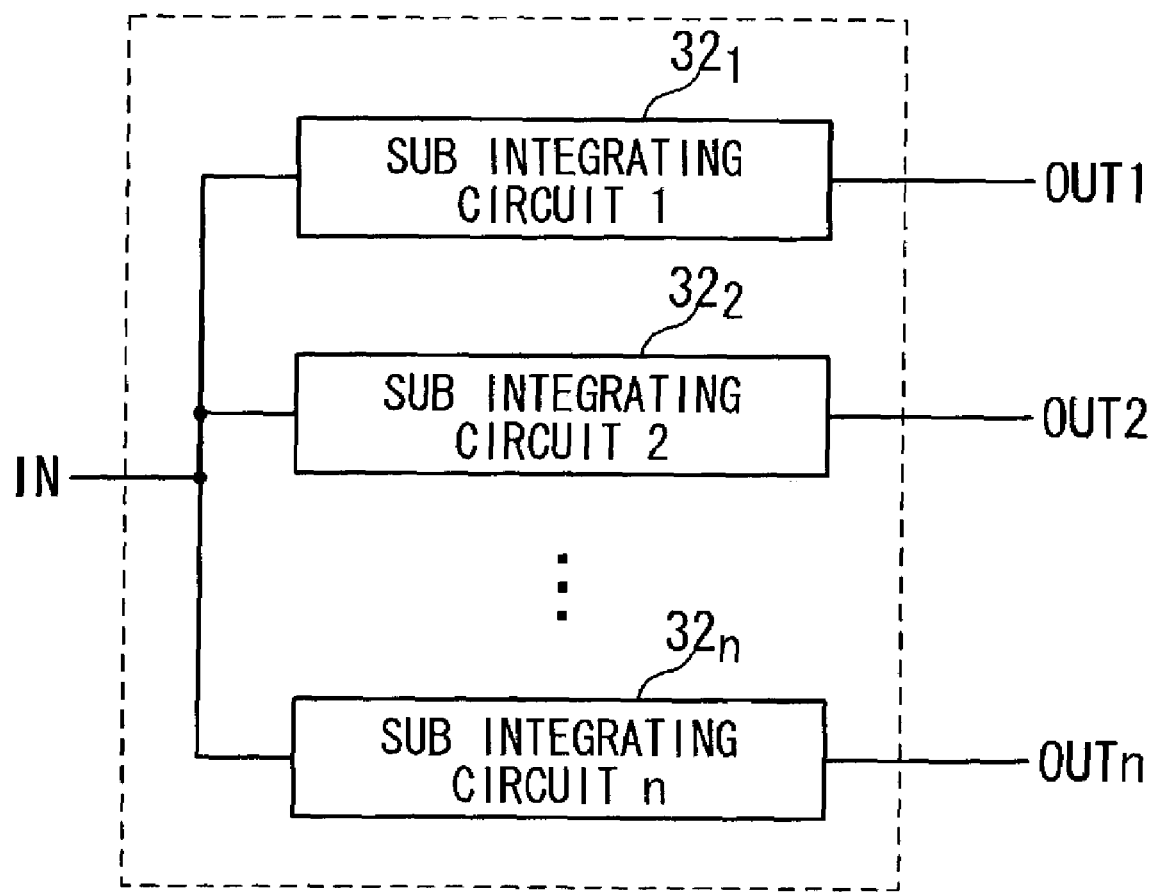
FIG. 23 is a block diagram showing the circuit structure of an integrating circuit of the demultiplexer apparatus according to a seventh embodiment of the present invention.

FIG. 23 is a diagram showing the circuit structure of the demultiplexer apparatus according to the sixth embodiment of the present invention. With reference to FIG. 23, the integrating circuit also has n sub-integrating circuits $32_1$ to $32_n$ similarly to the integrating circuit of FIG. 21. The outputs of the respective sub-integrating circuits are outputted in their original states to the external portion of the integrating circuit. Thus, one integrating circuit carries out the 1:n serial-to-parallel conversion. Therefore, if there are m integrating circuits, the 1:n×m serial-to-parallel conversions can be carried out in the entire circuit.

As mentioned above, the present invention has been described with reference to the above-mentioned embodiments. However, the present invention is not limited to the circuit structures of the above-mentioned embodiments. Various modifications that may be attained by one skilled in the art are included the scope of the present invention.

As explained above, according to the present invention, the input binary data is converted into the multi-value data having the lower frequency components. Thus, it is possible to process the input data exceeding the maximum operational frequency of the transistors constituting the circuit.

The invention claimed is:

1. A demultiplexer apparatus comprising a plurality of integrating circuits which operate in parallel,
   wherein said plurality of integrating circuits receive input time-series binary data commonly,
   each of the plurality of integrating circuits converts said input binary data in a current stage corresponding into multi-value data in said current stage, and generates recovery data in said current stage based on said multi-value data and recovery data from one of said plurality of integrating circuits in a stage immediately or more previous to said current stage integrating circuit, and
   said plurality of integrating circuits output the generated recovery data as parallel data to said input binary data,
   wherein each of said plurality of integrating circuits generates said recovery data in said current stage based on said multi-value data in said current stage and said recovery data from said immediately previous integrating circuit to said current stage integrating circuit, and outputs the generated recovery data to one of said plurality of integrating circuits in a next stage,
   wherein each of said plurality of integrating circuits comprises a converting unit which converts said input binary data into said multi-value data for every a predetermined bit quantity,
   wherein said converting unit adds said input binary data for every n bits (n is an integer of 2 or more) to generate said multi-value data,
   wherein said converting unit comprises an adding circuit,
   wherein said adding circuit comprises:
     a capacitor; and
     a switch, and
   said switch operates in response to a clock signal to carry out said addition such that a charge is stored in said capacitor and then the stored charge is discharged from said capacitor based on said input binary data, or such that the charge is discharged from said capacitor and then said capacitor is charged based on said input binary data.

2. The demultiplexer apparatus according to claim 1, wherein said adding circuit further comprises:
   a transfer gate connected to said capacitor; and
   an output capacitor connected through said transfer gate to said capacitor,
   a capacitance of said output capacitor being smaller than that of said capacitor.

3. The demultiplexer apparatus according to claim 1, wherein a capacitance of said capacitor is variable based on a period for every predetermined bit quantity of said input binary data.

4. The demultiplexer apparatus according to claim 3, wherein said capacitor comprises:
   a plurality of MOSFETs whose gate electrodes are connected in parallel, and
   the capacitance of said capacitor is adjusted by forming or extinguishing a gate channel of each of said plurality of MOSFETs based on a period for every predetermined bit quantity of said input binary data.

5. The demultiplexer apparatus according to claim 3, wherein a waveform of the clock signal is determined such tat current values associated with said capacitor in head and final portions of a period of the addition are smaller than a current value during a portion between the first and final portions in the period of the addition.

6. A demultiplexer apparatus comprising a plurality of integrating circuits which operate in parallel,
   wherein said plurality of integrating circuits receive input time-series binary data commonly, each of the plurality of integrating circuits converts said input binary data in a current stage corresponding into multi-value data in said current stage, and generates recovery data in said current stage based on said multi-value data and recovery data from one of said plurality of integrating circuits in a stage immediately or more previous to said current stage integrating circuit, and said plurality of integrating circuits output the generated recovery data as parallel data to said input binary data, wherein each of said plurality of integrating circuits generates said recovery data in said current stage based on said multi-value data in said current stage and said recovery data from said immediately previous integrating circuit to said current stage integrating circuit, and outputs the generated recovery data to one of said plurality of integrating circuits in a next stage, wherein each of said plurality of integrating circuits generates intermediate binary data from said input binary data, and comprises:

a plurality of recovering circuits provided for possible estimations of said recovery data from said immediately previous stage integrating circuit, wherein each of said plurality of recovering circuits generates said recovery data estimation based on said intermediate binary data and a corresponding one of the estimations; and a selecting circuit which selects one of said recovery data estimations based on said recovery data from said immediately previous stage integrating circuit, and outputs the selected recovery data estimation as said recovery data of said current stage integrating circuit.

7. A demultiplexer apparatus comprising a plurality of integrating circuits which operate in parallel, wherein said plurality of integrating circuits receive input time-series binary data commonly, each of the plurality of integrating circuits converts said input binary data in a current stage corresponding into multi-value data in said current stage, and generates recovery data in said current stage based on said multi-value data and recovery data from one of said plurality of integrating circuits in a state immediately or more previous to said current stage integrating circuit, said plurality of integrating circuits output the generated recovery data parallel data to said input binary data, wherein each of said plurality of integrating circuits generates said recovery data in said current stage based on said multi-value data in said current stage and said recovery data from said immediately previous integrating circuit to said current stage integrating circuit, and outputs the generated recovery data to one of said plurality of integrating circuits in a next stage, wherein each of said plurality of integrating circuits generates intermediate binary data from said input binary data, and comprises:

a plurality of recovering circuits, each of which generates one portion of said recovery data in said current stage based on a corresponding portion of said intermediate binary data and said recovery data of said immediately previous stage integrating circuit;

a first switch which sequentially selects one of said plurality of recovering circuits and sends the corresponding portion of said intermediate binary data to the selected recovering circuit; and a second switch which sequentially selects one of said plurality of recovering circuits and outputs the portion of said recovery data in said current stage from the selected recovering circuit, and whereby said recovery data is outputted from said integrating circuit.

8. A demultiplexer apparatus comprising a plurality of integrating circuits which operate in parallel, wherein said plurality of integrating circuits receive input time-series binary data commonly, each of the plurality of integrating circuits converts said input binary data in a current stage corresponding into multi-value data in said current stage, and generates recovery data in said current stage based on said multi-value data and recovery data from one of said plurality of integrating circuits in a stage immediately or more previous to said current stage integrating circuit, and said plurality of integrating circuits output the generated recovery data as parallel data to said input binary data, wherein each of said plurality of integrating circuits generates said recovery data in said current stage based on said multi-value data in said current stage and said recovery data from said immediately previous integrating circuit to said current stage integrating circuit, and outputs the generated recovery data to one of said plurality of integrating circuits in a next stage, wherein each of said plurality of integrating circuits comprises:

a first converting unit which generates first multi-value data from said input binary data for every predetermined bit quantity of said input binary data; and a second converting unit which generates second multi-value data from said input binary data for every predetermined bit quantity of said input binary data, said multi-value data contains the first multi-value data and the second multi-value data, and the second multi-value data contains data of a polarity opposite to that of the first multi-value data.

9. The demultiplexer apparatus according to claim 8, wherein each of said first and second converting units adds said input binary data for every n bits (n is an integer of 2 or more) to generate said multi-value data.

10. The demultiplexer apparatus according to claim 8, wherein each of said first and second converting units comprises an adding circuit, said adding circuit comprises:

a capacitor; and a switch, and said switch operates in response to a clock signal to carry out addition such that a charge is stored in said capacitor and then the stored charge is discharged from said capacitor based on said input binary data, or such that the stored charge is discharged from said capacitor, and then said capacitor is charged based on said input binary data.

11. The demultiplexer apparatus according to claim 10, wherein said adding circuit further comprises:

a transfer gate connected to said capacitor; and an output capacitor connected through said transfer gate to said capacitor, a capacitance of said output capacitor being smaller than that of said capacitor.

12. The demultiplexer apparatus according to claim 10, wherein the capacitance of said capacitor is variable based on a period for every predetermined bit quantity of said input binary data.

13. The demultiplexer apparatus according to claim 12, wherein said capacitor comprises:

a plurality of MOSFETs whose gate electrodes are connected in parallel, and the capacitance of said capacitor is adjusted by forming or extinguishing a gate channel of each of said plurality of MOSFEs based on a period for every predetermined bit quantity of said input binary data.

14. The demultiplexer apparatus according to claim 12, wherein a waveform of the clock signal is determined such that current values associated with said capacitor in first and final portions of a period of the addition are smaller than that of a portion between the first and final portions of the period of the addition.

15. The demultiplexer apparatus according to claim 8, wherein each of said plurality of integrating circuits are provided for said first and second converting units, and comprises:
 a plurality of comparing circuits which convert the multi-value data into intermediate binary data using at least a threshold.

16. The demultiplexer apparatus according to claim 15, wherein each of said plurality of integrating circuits further comprises:
 a recovering circuit which generates said recovery data in said current stage based on said intermediate binary data and said recovery data from said immediately previous stage integrating circuit.

17. The demultiplexer apparatus according to claim 8, wherein each of said plurality of integrating circuits comprises:
 a latching circuit which adjusts a timing such that the generated recovery data are simultaneously outputted from said plurality of integrating circuits as said parallel data to said input binary data.

18. A communication apparatus comprising:
 a receiving circuit which generates a time-series binary data from a reception signal; and
 a demultiplexer apparatus comprising a plurality of integrating circuits which receive in parallel said time-series binary data,
 wherein each of the plurality of integrating circuits converts said input binary data in a current stage corresponding into multi-value data in said current stage, and generates recovery data in said current stage based on said multi-value data and recovery data from one of said plurality of integrating circuits in a stage immediately or more previous to said current stage integrating circuit, and said plurality of integrating circuits output the generated recovery data as parallel data to said input binary data,
 wherein each of said plurality of integrating circuits generates said recovery data in said current stage based on said multi-value data in said current stage and said recovery data from said immediately previous integrating circuit to said current stage integrating circuit, and outputs the generated recovery data to one of said plurality of integrating circuits in a next stage,
 wherein each of said plurality of integrating circuits comprises:
 a converting unit which converts said input binary data into said multi-value data for every a predetermined bit quantity
 wherein said converting unit adds said input binary data for every n bits (n is an integer of 2 or more) to generate said multi-value data,
 wherein said converting unit comprises an adding circuit, wherein said adding circuit comprises:
  a capacitor; and
  a switch, and
 said switch operates in response to a clock signal to carry out said addition such that a charge is stored in said capacitor and then the stored charge is discharged from said capacitor based on said input binary data, or such that the charge is discharged from said capacitor and then said capacitor is charged based on said input binary data.

19. The communication apparatus according to claim 18, wherein said adding circuit further comprises:
 a transfer gate connected to said capacitor; and
 an output capacitor connected through said transfer gate to said capacitor,
 a capacitance of said output capacitor being smaller than that of said capacitor.

20. The communication apparatus according to claim 18, wherein a capacitance of said capacitor is variable based on a period for every predetermined bit quantity of said input binary data.

21. The communication apparatus according to claim 20, wherein said capacitor comprises:
 a plurality of MOSFETs whose gate electrodes are connected in parallel, and
 the capacitance of said capacitor is adjusted by forming or extinguishing a gate channel of each of said plurality of MOSFETs based on a period for every predetermined bit quantity of said input binary data.

22. The communication apparatus according to claim 20, wherein a waveform of the clock signal is determined such that current values associated with said capacitor in head and final portions in a period of the addition are smaller than a current value during a portion between the first and final portions in a period of the addition.

23. A demultiplexer apparatus comprising:
 first to N-th integrating circuits (N is an integer of two or more) operating in parallel, which commonly receive a serial binary data,
 wherein said first to N-th integrating circuits operate in response to first to N-th clock signals whose phases are different from one another,
 each of said integrating circuits refers to an output of one of said integrating circuits in an immediately previous stage,
 one of said integrating circuits in a first stage refers to an output of said N-th integrating circuit, and
 each of the integrating circuits comprises:
  an adding circuit which adds said serial binary data for a plurality of bits to produce multi-value data;
  a comparing circuit which compares said multi-value data obtained by the addition by said adding circuit with reference data to generate a plurality of binary data; and
  a recovering unit which recovers parallel binary data from said plurality of binary data outputted from said comparing circuit and an output of said immediately previous stage integrating circuit, and outputs at least a part of said recovered parallel binary data to one of said integrating circuits in a next stage.

24. The demultiplexer apparatus according to claim 23, wherein said adding circuit comprises:
 a first conductive type of a first MOS transistor, a second conductive type of a second MOS transistor, and the second conductive type of a third MOS transistor, wherein said first to third MOS transistors are connected in series between a high potential side power supply and a low potential side power supply, a clock signal to be supplied to the integrating circuit is supplied to gates of said first and third MOS transistors, said serial binary data is supplied to a gate of said second MOS transistor;
 a first capacitor, whose one end is connected to a connection point between drains of said first MOS transistor and said second MOS transistor, and the other end is connected to the low or high potential side power supply, and a capacitance is variable;

a transfer switch, which, is connected between the one end of said first capacitor and the output end of said adding circuit and controlled to be turned on and off by the clock signal; and a second capacitor in which one end is connected to a connection point between said transfer switch and the output end, and the other end is connected to the low or high potential side power supply, a capacitance of said second capacitor being smaller than that of said first capacitor.

* * * * *